United States Patent
Jeong

(10) Patent No.: US 8,143,150 B2
(45) Date of Patent: Mar. 27, 2012

(54) METHOD OF FABRICATING SEMICONDUCTOR DEVICE AND ELECTRONIC SYSTEM

(75) Inventor: Hoon Jeong, Hwaeseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/007,822

(22) Filed: Jan. 17, 2011

(65) Prior Publication Data

US 2011/0207289 A1    Aug. 25, 2011

(30) Foreign Application Priority Data

Feb. 23, 2010  (KR) ........................ 10-2010-0016267

(51) Int. Cl.
*H01L 21/425*    (2006.01)

(52) U.S. Cl. ......... 438/514; 257/E21.613; 257/E21.662; 257/E27.078; 257/E27.084; 365/148; 365/163; 438/424; 438/427; 438/546; 438/700; 438/745

(58) Field of Classification Search ........... 257/E21.613, 257/E21.662, E27.078, E27.084; 365/148, 365/163; 438/424, 427, 514, 546, 700, 745
See application file for complete search history.

(56) References Cited

U.S. PATENT DOCUMENTS

| 6,849,564 | B2 | 2/2005 | Hsu et al. | |
| 2008/0112211 | A1* | 5/2008 | Toda | 365/148 |
| 2009/0065759 | A1 | 3/2009 | Kim | |
| 2009/0067228 | A1 | 3/2009 | Kang et al. | |
| 2010/0061140 | A1* | 3/2010 | Klostermann et al. | 365/148 |
| 2010/0321990 | A1* | 12/2010 | Happ et al. | 365/163 |
| 2011/0089394 | A1* | 4/2011 | Kakegawa | 257/4 |

FOREIGN PATENT DOCUMENTS

| JP | 2004-260162 | 9/2004 |
| JP | 2009-065159 | 3/2009 |
| KR | 1020040077492 | 9/2004 |
| KR | 100887058 | 2/2009 |
| KR | 1020090025705 | 3/2009 |

* cited by examiner

*Primary Examiner* — Asok Sarkar
(74) *Attorney, Agent, or Firm* — F. Chau & Associates, LLC

(57) ABSTRACT

A method of fabricating a semiconductor device includes forming a well impurity region, a lower impurity region and an upper impurity region in a semiconductor substrate. The lower impurity region has a different conductivity type than a conductivity type of the well impurity region, the upper impurity region has a different conductivity type than the conductivity type of the lower impurity region, and the upper impurity region has a same conductivity type as the conductivity type of the well impurity region and has a higher impurity concentration than an impurity concentration of the well impurity region. The semiconductor substrate is etched to form lower semiconductor patterns, upper semiconductor patterns upwardly projecting from predetermined regions of the lower semiconductor patterns. An isolation layer filling the first and second spaces between the lower semiconductor patterns and between the upper semiconductor patterns, respectively is formed.

20 Claims, 20 Drawing Sheets

METHOD OF FABRICATING SEMICONDUCTOR DEVICE AND ELECTRONIC SYSTEM

CROSS-REFERENCE TO RELATED APPLICATION

This application claims priority under 35 U.S.C. §119 to Korean Patent Application No. 10-2010-0016267 filed on Feb. 23, 2010, the disclosure of which is hereby incorporated by reference in its entirety.

BACKGROUND

1. Technical Field

Embodiments of the inventive concept relate to a semiconductor device, methods of fabricating the same and an electronic system employing the semiconductor device.

2. Description of Related Art

As semiconductor devices become highly integrated, research into reducing an area taken by elements constituting a semiconductor device is underway.

SUMMARY

Embodiments of the inventive concept may provide semiconductor devices employing a vertical diode as a switching device and methods of fabricating the same.

Embodiments of the inventive concept may also provide a semiconductor device having a metal-semiconductor compound and a method of fabricating the same.

Embodiments of the inventive concept may further provide a memory card including a semiconductor device having a diode and/or a metal-semiconductor compound.

Embodiments of the inventive concept may further provide an electronic system including a semiconductor device having a diode and/or a metal-semiconductor compound.

The technical objectives of the inventive concept are not limited to the above disclosure; other objectives may become apparent to those of ordinary skill in the art based on the following descriptions.

In accordance with an aspect of the inventive concept, a method of fabricating a semiconductor device includes: forming a well impurity region, a lower impurity region and an upper impurity region in a semiconductor substrate. The lower impurity region has a different conductivity type from a conductivity type of the well impurity region, the upper impurity region has a different conductivity type than the conductivity type of the lower impurity region, and the upper impurity region has a same conductivity type as the conductivity type of the well impurity region and has a higher impurity concentration than an impurity concentration of the well impurity region. The semiconductor substrate is etched to form lower semiconductor patterns and upper semiconductor patterns upwardly projecting from predetermined regions of the lower semiconductor patterns, a first space between the upper semiconductor patterns projecting from the lower semiconductor patterns and a second space between the lower semiconductor patterns. The upper semiconductor patterns have sidewalls vertically arranged with facing sidewalls of the lower semiconductor patterns and facing each other.and the second space between the lower semiconductor patterns has a bottom surface disposed at a lower level than the lower impurity region. Top surfaces of the lower semiconductor patterns disposed between the upper semiconductor patterns are disposed at a lower level than the upper impurity region and are disposed at a higher level than a bottom surface of the lower impurity region. An isolation layer filling the first and second spaces between the lower semiconductor patterns and between the upper semiconductor patterns, respectively is formed.

The lower impurity region may include a first impurity region and a second impurity region disposed on the first impurity region. The first impurity region and the second impurity region may have the same conductivity type as one another, and the first impurity region may have a higher impurity concentration than an impurity concentration of the second impurity region. Here, the lower impurity region and the upper impurity region may constitute a diode.

Forming the lower and upper semiconductor patterns may include: forming hard masks on the semiconductor substrate having the impurity regions, the hard masks being formed in the shape of lines of a first orientation, etching the semiconductor substrate using the hard masks as etch masks to form preliminary trenches, foaming a sacrificial layer filling the preliminary trenches, forming sacrificial masks on the substrate having the sacrificial layer, the sacrificial masks being formed in the shape of lines of a second orientation crossing the first orientation, etching the hard masks using the sacrificial masks as etch masks and forming hard mask patterns, removing the sacrificial masks and the sacrificial layer; and etching bottom regions of the preliminary trenches formed in the semiconductor substrate and the semiconductor substrate between the preliminary trenches using the hard mask patterns as etch masks to form lower semiconductor patterns spaced apart from each other and upper semiconductor patterns upwardly projecting from predetermined regions of the lower semiconductor patterns.

Forming the lower semiconductor patterns and the upper semiconductor patterns may include: forming hard masks on the semiconductor substrate having the impurity regions, the hard masks being formed in the shape of lines of a first orientation, etching the semiconductor substrate using the hard masks as etch masks, and forming trenches, the trenches having bottom regions disposed at a lower level than the lower impurity region; forming a sacrificial layer filling the trenches; forming sacrificial masks on the semiconductor substrate having the sacrificial layer, the sacrificial masks being formed in the shape of lines of a second orientation crossing the first orientation, etching the hard masks using the sacrificial masks as etch masks and forming a plurality of hard mask patterns spaced apart from each other; etching the semiconductor substrate between the trenches to a depth at a level lower than the upper impurity region and at a level higher than a bottom surface of the lower impurity region using the hard mask patterns and the sacrificial layer as etch masks, and forming the lower semiconductor patterns and the upper semiconductor patterns that are defined between the trenches and removing the sacrificial masks and the sacrificial layer.

The method may further include: partially etching the isolation layer to form a preliminary lower isolation pattern filling a space between the lower semiconductor patterns and exposing sidewalls of the upper semiconductor patterns where the upper impurity region is disposed, forming sidewall spacers surrounding the exposed sidewalls of the upper semiconductor patterns, the sidewall spacers being spaced apart from each other, partially etching the preliminary lower isolation pattern to form the lower isolation pattern, a top surface of the lower isolation pattern being disposed at a higher level than a bottom surface of the lower impurity region, forming a metal-semiconductor compound layer on sidewalls of the lower semiconductor patterns, which are not covered with the lower isolation pattern, and on top surfaces of the lower semiconductor patterns between the upper semiconductor patterns; forming an insulating material layer on the semiconductor substrate having the metal-semiconductor compound layer; and planarizing the insulating material layer until the hard mask patterns are exposed to form an upper isolation layer.

The metal-semiconductor compound layer may extend to partially cover the sidewalls of the upper semiconductor patterns, and may be disposed at a lower level than the upper impurity region to be spaced apart from the upper impurity region.

In accordance with another aspect of the inventive concept, a method of fabricating a semiconductor device includes: foaming a lower impurity region and an upper impurity region having different conductivity types than one another in a semiconductor substrate. The upper impurity region is disposed over the lower impurity region. The semiconductor substrate is etched to form lower semiconductor patterns, upper semiconductor patterns upwardly projecting from predetermined regions of the lower semiconductor patterns, and a space between the lower semiconductor patterns having a bottom surface disposed at a lower level than the lower impurity region. Top surfaces of the lower semiconductor patterns disposed between the upper semiconductor patterns are disposed at a lower level than the upper impurity region and are disposed at a higher level than the bottom surface of the lower impurity region. Spacers covering sidewalls of the upper semiconductor patterns are formed to surround a boundary region between the lower impurity region and the upper impurity region. A lower isolation pattern partially filling the space between the lower semiconductor patterns is formed, and a top surface of the lower isolation pattern is disposed at a higher level than a bottom surface of the lower impurity region. A metal-semiconductor compound layer is formed on sidewalls of the lower semiconductor patterns, which are not covered with the lower isolation pattern, and on top surfaces of the lower semiconductor patterns between the upper semiconductor patterns.

The metal-semiconductor compound layer may extend to partially cover sidewalls of the upper semiconductor patterns, and may be disposed at a lower level than the upper impurity region to be spaced apart from the upper impurity region.

The lower impurity region may include a first impurity region and a second impurity region disposed on the first impurity region. The first impurity region and the second impurity region may have the same conductivity type as one another, and the first impurity region may have a higher impurity concentration than an impurity concentration of the second impurity region.

The method may further include forming a well impurity region having a same conductivity type as the upper impurity region and having a lower impurity concentration than the upper impurity region in the semiconductor substrate below the lower impurity region. The well impurity region may be formed in the semiconductor substrate between the lower semiconductor patterns, may extend into the lower semiconductor patterns and may be disposed at a lower level than the lower impurity region.

The spacers may surround sidewalls of the upper semiconductor patterns where the upper impurity region is disposed, and may extend towards sidewalls of the upper semiconductor patterns where the lower impurity region is disposed.

Forming the spacers may include: forming a preliminary isolation layer on the semiconductor substrate having the lower and upper semiconductor patterns, partially etching the preliminary isolation layer to form a preliminary isolation pattern, the preliminary isolation pattern filling the spaces between the lower semiconductor patterns, covering top surfaces of the lower semiconductor patterns disposed between the upper semiconductor patterns, and a top surface of the preliminary isolation pattern being disposed at a lower level than the upper impurity region; and forming the spacers covering sidewalls of the upper semiconductor patterns, which are not covered with the preliminary isolation pattern.

Forming the lower isolation pattern may include partially etching the preliminary isolation pattern, exposing top surfaces of the lower semiconductor patterns disposed between the upper semiconductor patterns, and exposing sidewalls of the lower semiconductor patterns where the lower impurity region remains.

Forming the lower semiconductor patterns and the upper semiconductor patterns may include: forming hard masks on the semiconductor substrate, the hard masks being formed in the shape of lines parallel to each other and having a first orientation; etching the semiconductor substrate using the hard masks as etch masks to form preliminary trenches; forming a sacrificial layer filling the preliminary trenches; forming sacrificial masks on the substrate having the sacrificial layer, the sacrificial masks being formed in the shape of lines of a second orientation crossing the first orientation; etching the hard masks using the sacrificial masks as etch masks and forming a plurality of hard mask patterns spaced apart from each other, removing the sacrificial masks and the sacrificial layer and etching bottom regions of the preliminary trenches formed in the semiconductor substrate and the semiconductor substrate between the preliminary trenches using the hard mask patterns as etch masks.

Forming the lower semiconductor patterns and the upper semiconductor patterns may include: forming hard masks on the semiconductor substrate, the hard masks being formed in the shape of lines parallel to each other and having a first orientation, etching the semiconductor substrate using the hard masks as etch masks and forming trenches, the trenches having bottom regions disposed at a lower level than the lower impurity region, forming a sacrificial layer filling the trenches, forming sacrificial masks on the semiconductor substrate having the sacrificial layer, the sacrificial masks being formed in the shape of lines of a second orientation crossing the first orientation, etching the hard masks using the sacrificial masks as etch masks to form a plurality of hard mask patterns spaced apart from each other, etching the semiconductor substrate between the trenches to a depth at a level lower than the upper impurity region and at a level higher than a bottom surface of the lower impurity region using the hard mask patterns and the sacrificial layer as etch masks to form the lower semiconductor patterns and the upper semiconductor patterns that are defined between the trenches and removing the sacrificial masks and the sacrificial layer.

The method may further include: forming an insulating material layer on the semiconductor substrate having the metal-semiconductor compound layer, planarizing the insulating material layer and forming an upper isolation layer, the upper isolation layer being formed on the lower isolation pattern, and filling spaces between the lower semiconductor patterns that are not filled with the lower isolation pattern and between the upper semiconductor patterns.

The method may further include: forming conductive patterns electrically connected to the upper impurity regions, forming information storage elements on the conductive patterns and forming conductive lines in the shape of lines having an orientation crossing the lower semiconductor patterns on the information storage elements.

The spacers may be formed of a different material from the lower isolation pattern.

The method may further include removing the spacers after forming the metal-semiconductor compound layer.

In accordance with still another aspect of the inventive concept, an electronic system includes: a control unit and a storage unit electrically connected to the control unit. Here, the storage unit may include a semiconductor device fabricated by a fabrication method including: forming a well impurity region, a lower impurity region and an upper impurity region in a semiconductor substrate, the lower impurity region having a different conductivity type from the well impurity region, the upper impurity region having a different conductivity type from a conductivity type of the lower impurity region, and the upper impurity region having a same conductivity type as the conductivity type of the well impurity region and having a higher impurity concentration than an impurity concentration of the well impurity region, etching the semiconductor substrate to lower semiconductor patterns, upper semiconductor patterns upwardly projecting from predetermined regions of the lower semiconductor patterns, a first space between the upper semiconductor patterns projecting from the lower semiconductor patterns and a second space between the lower semiconductor patterns. The upper semiconductor patterns having sidewalls vertically arranged with facing sidewalls of the lower semiconductor patterns and facing each other, and the second space between the lower semiconductor patterns has a bottom surface disposed at a lower level than the lower impurity region, and top surfaces of the lower semiconductor patterns disposed between the upper semiconductor patterns are disposed at a lower level than the upper impurity region and are disposed at a higher level than the lower impurity region. The method further includes forming an isolation layer filling the first and second spaces between the lower semiconductor patterns and between the upper semiconductor patterns, respectively.

In accordance with yet another aspect of the inventive concept, a semiconductor device includes lower semiconductor patterns provided on a semiconductor substrate and spaced apart from each other. Upper semiconductor patterns upwardly projecting from the lower semiconductor patterns to have sidewalls vertically arranged with facing sidewalls of the lower semiconductor patterns and facing each other are provided. A well impurity region provided in the semiconductor substrate and extending into the lower semiconductor patterns is formed. Lower impurity regions disposed at a higher level than the well impurity region, formed in the lower semiconductor patterns and extending into the upper semiconductor patterns are provided. Upper impurity regions disposed at a higher level than the lower impurity regions, formed in the upper semiconductor patterns and constituting a diode together with the lower impurity regions are provided. An isolation region filling spaces between the lower semiconductor patterns and the upper semiconductor patterns is provided. Each of the lower impurity regions includes formed of a first impurity region adjacent to the well impurity region and a second impurity region adjacent to the upper impurity region, and the first impurity region has a higher impurity concentration than the second impurity region.

The isolation region may include a lower isolation pattern partially filling spaces between the lower semiconductor patterns and having a top surface disposed between a bottom surface and a top surface of the first impurity region, and an upper isolation pattern formed on the lower isolation pattern and filling the remaining space between the lower semiconductor patterns and between the upper semiconductor patterns.

The device may further include a metal-semiconductor compound layer covering sidewalls of the lower semiconductor patterns and top surfaces of the lower semiconductor patterns between the upper semiconductor patterns. Here, the metal-semiconductor compound layer may be disposed at a higher level than the well impurity region and may be electrically insulated from the well impurity region.

The metal-semiconductor compound layer may extend to cover a part of sidewalls of the upper semiconductor patterns below a boundary region between the upper impurity region and the lower impurity region, and may be electrically insulated from the upper impurity region.

The device may further include insulating spacers surrounding sidewalls of the upper semiconductor patterns disposed at a higher level than the metal-semiconductor compound layer.

Viewed from a plan view, the lower semiconductor patterns may be in the shape of lines spaced apart from each other, and the plurality of upper semiconductor patterns may be formed on one lower semiconductor pattern.

In accordance with another aspect of the inventive concept, a method of fabricating a semiconductor device is provided. The method includes performing an ion-implantation process to form a well impurity region, a lower impurity region and an upper impurity region in a semiconductor substrate. The lower impurity region has a different conductivity type from a conductivity type of the well impurity region, the upper impurity region has a different conductivity type from than the conductivity type of the lower impurity region, and the upper impurity region has a same conductivity type as the conductivity type of the well impurity region and has a higher impurity concentration than an impurity concentration of the well impurity region. Also, the upper impurity region and the lower impurity region constitute a diode and a lower part of the lower impurity region constitutes word lines. The method further includes etching the semiconductor substrate to form lower semiconductor patterns, upper semiconductor patterns upwardly projecting from predetermined regions of the lower semiconductor patterns, a first space between the upper semiconductor patterns projecting from the lower semiconductor patterns, and a second space between the lower semiconductor patterns having a bottom surface disposed at a lower level than the lower impurity region, and top surfaces of the lower semiconductor patterns disposed between the upper semiconductor patterns are disposed at a lower level than the upper impurity region and disposed at a higher level than a bottom surface of the lower impurity region. In addition, the method further includes forming an isolation layer filling the first and the second spaces between the lower semiconductor patterns and between the upper semiconductor patterns, respectively, forming a first interlayer insulating layer on the semiconductor substrate having the isolation layer, forming holes penetrating the first interlayer insulating layer exposing the upper impurity regions, performing a silicide process to form a metal-semiconductor compound layer on the upper impurity regions. The metal-semiconductor compound layer is formed of one of cobalt silicide, titanium silicide, and nickel silicide. The method further includes forming metal plugs on the metal-semiconductor compound layer by filling the holes in the first interlayer insulating layer, forming a second interlayer insulating layer on the semiconductor substrate having the metal plugs, forming first conductive patterns penetrating the second interlayer insulating layer and electrically connected to the metal plugs, sequentially forming information storage patterns and second conductive patterns on the semiconductor substrate having the first conductive patterns. The information storage elements include a phase-change material layer whose resistance to a flowing current varies depending on a phase. The information storage patterns are electrically connected to the diode formed of the upper impurity region and the lower impurity region through the first conductive patterns, the metal plugs and the metal semiconductor compound layer. Moreover, the method further includes forming conductive lines on the second conductive patterns in the shape of lines crossing the lower semiconductor patterns and the conductive lines constitute bit lines.

BRIEF DESCRIPTION OF THE DRAWINGS

The inventive concepts can be understood in more detail from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EXEMPLARY EMBODIMENTS

Figure 1:
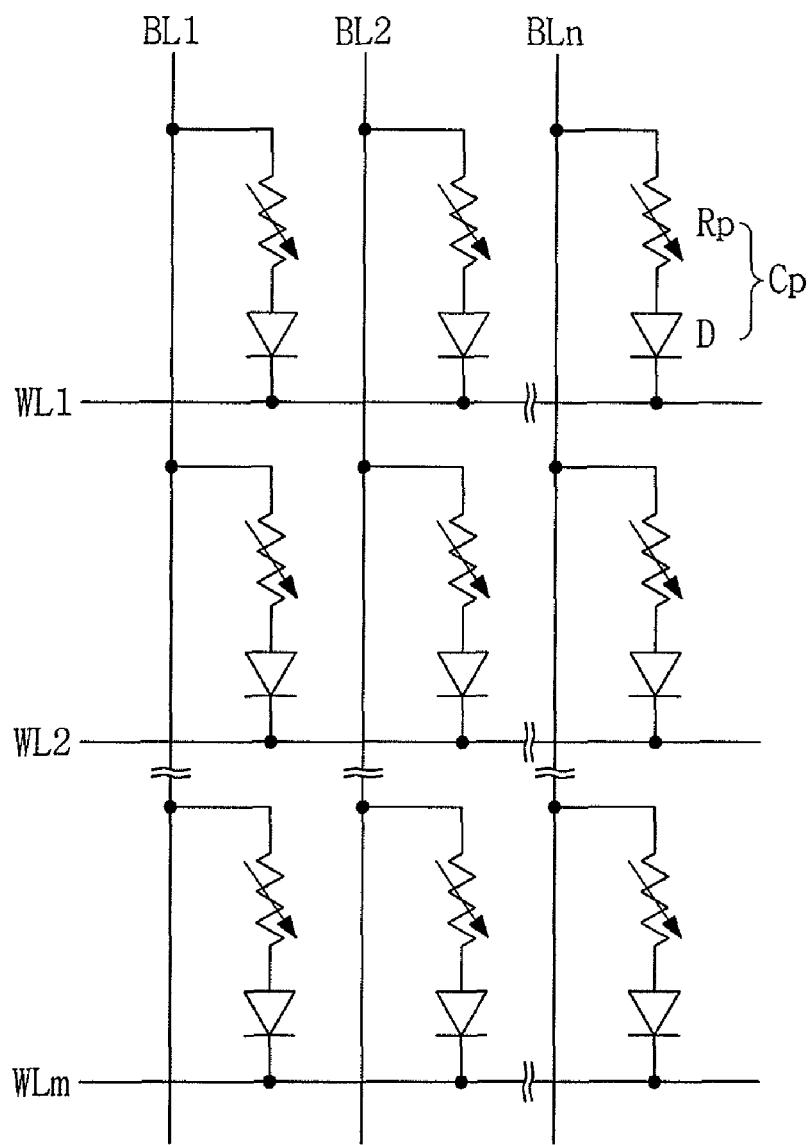
FIG. 1 is an equivalent circuit diagram of a part of a memory cell according to an exemplary embodiment of the inventive concept.

Various embodiments will now be described more fully with reference to the accompanying drawings in which some embodiments are shown. These inventive concepts may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the teem "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a memory cell employing a diode according to embodiments of the inventive concept. The memory device may include a plurality of word lines WL1, WL2, . . . , WLm and a plurality of bit lines BL1, BL2, . . . , BLn intersecting at a cell array region. Here, "m" and "n" may respectively denote positive integers.

Memory cells Cp may be provided at intersections of the word lines WL1, WL2, . . . , WLm and the bit lines BL1, BL2, . . . , BLn. Each of the memory cells Cp may include an information storage element Rp and a diode D electrically connected to each other. One side of the information storage element Rp may be electrically connected to a P-type semiconductor of the diode D and the other side of the information storage element Rp may be electrically connected to one of the bit lines BL1, BL2, . . . , BLn. Also, an N-type semiconductor of the diode D may be electrically connected to one of the word lines WL1, WL2, . . . , WLm.

Each of the information storage elements Rp may be a resistance memory element that exhibits at least two distinguishable resistance states, e.g., a high resistance and a low resistance, depending on an applied signal. For example, the resistance memory element may include a perovskite memory element, a phase-change memory element, a magnetic memory element, a conductive metal oxide (CMO) memory element, a solid electrolyte memory element, and a polymer memory element. The perovskite memory element may include, for example, a colossal magnetoresistive (CMR) material, a high-temperature superconducting (HTSC) material, etc. The solid electrolyte memory element may include a metal ion that is movable in a solid electrolyte, and thus may include a material capable of forming conductive bridging.

Embodiments of the inventive concept in which a phase-change memory element is employed as an information storage element Rp will be described below. Therefore, the following descriptions may be applied to a semiconductor device that employs the above-described various memory elements.

Figure 2:
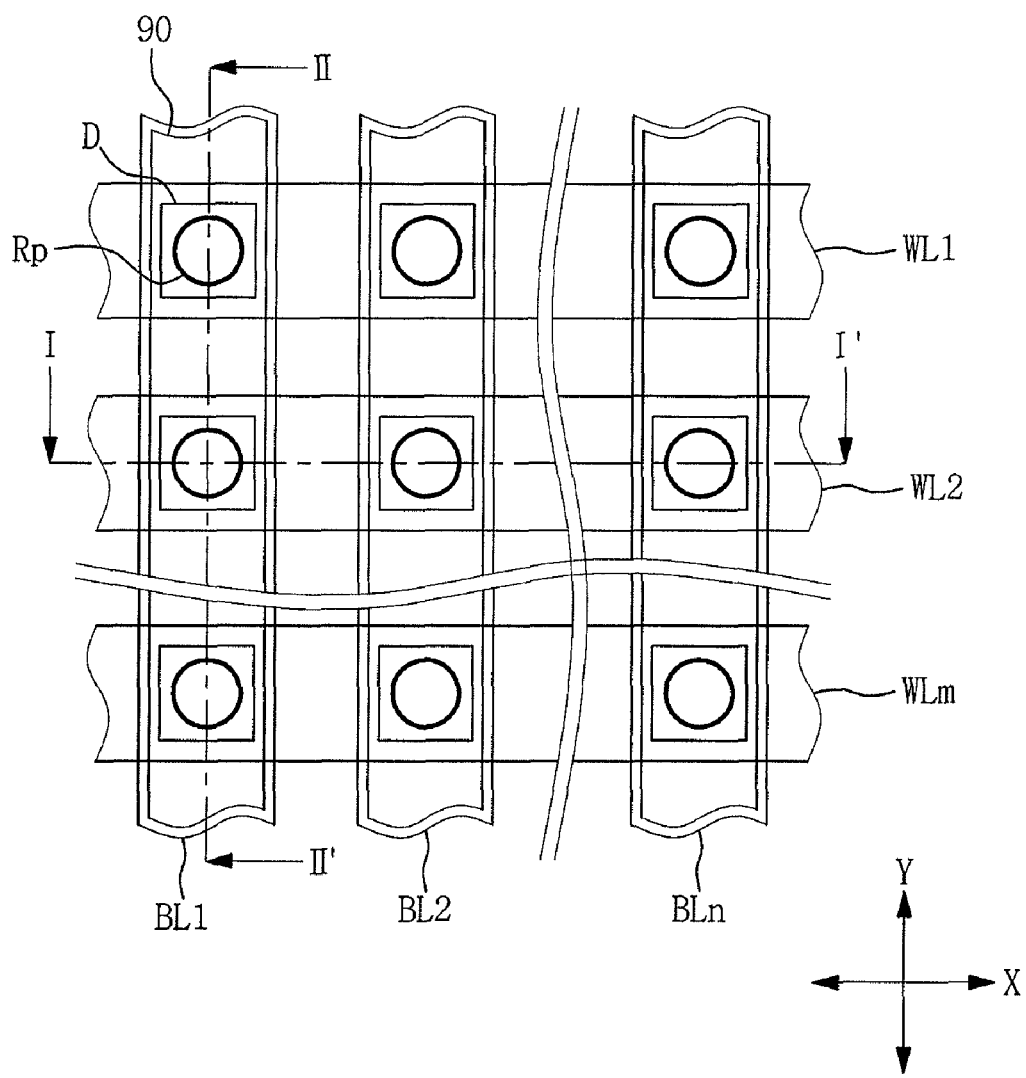
FIG. 2 is a plan view corresponding to the equivalent circuit diagram of FIG. 1.

FIG. 2 is a plan view of a semiconductor device according to embodiments of the inventive concept, FIGS. 3A to 9B are cross-sectional views of a semiconductor device according to one embodiment of the inventive concept, FIGS. 10A to 13B are cross-sectional views of a semiconductor device according to another embodiment of the inventive concept, and FIGS. 14A to 17B are cross-sectional views of a semiconductor device according to still another embodiment of the inventive concept. In FIGS. 3A to 17B, FIGS. 3A, 4A, 5A, 6A, 7A, 8A, 9A, 10A, 11A, 12A, 13A, 14A, 15A, 16A and 17A are cross-sectional views taken along line I-I' of FIG. 2, and FIGS. 3B, 4B, 5B, 6B, 7B, 8B, 9B, 10B, 11B, 12B, 13B, 14B, 15B, 16B and 17B are cross-sectional views taken along line II-II' of FIG. 2.

First, a semiconductor device according to one embodiment of the inventive concept will be described with reference to FIGS. 2, 9A and 9B.

Figure 9A:
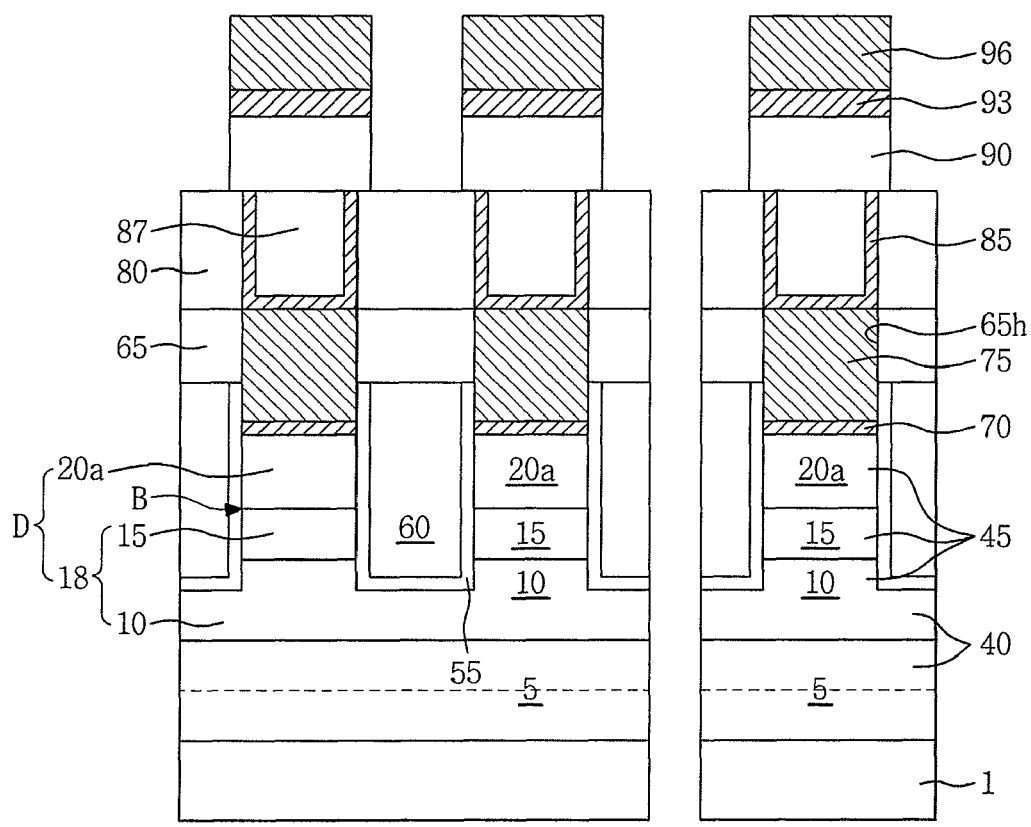
Figure 9B:
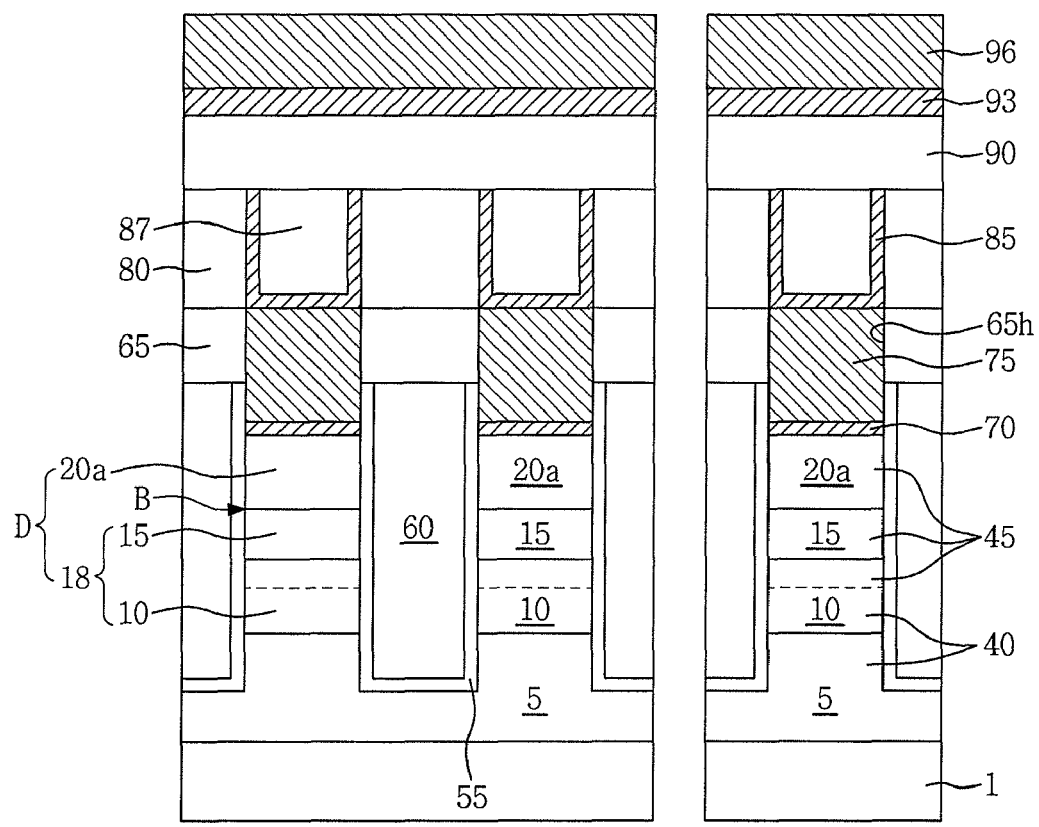

Referring to FIGS. 2, 9A and 9B, a semiconductor substrate 1 may be provided. The semiconductor substrate 1 may be, for example, a silicon substrate. A plurality of lower semiconductor patterns 40 spaced apart from each other may be provided on the semiconductor substrate 1. The lower semiconductor patterns 40 may be, for example, in the shape of lines spaced apart from each other. Upper semiconductor patterns 45 upwardly projecting from predetermined regions of the lower semiconductor patterns 40 and spaced apart from each other may be provided. A plurality of upper semiconductor patterns 45 upwardly projecting from one lower semiconductor pattern 40 and spaced apart from each other may be provided. That is, as illustrated in FIG. 9B, the upper semiconductor patterns 45 may be vertically arranged with facing sidewalls of the lower semiconductor patterns 40 and may have facing sidewalls. The lower semiconductor patterns 40 may be formed in, for example, the shape of lines having a first orientation X.

Each of the lower semiconductor patterns 40 may include a part of a well impurity region 5 and a part of a lower impurity region 18. Further, each of the upper semiconductor patterns 45 may include a part of the lower impurity region 18 and an upper impurity region 20a.

The well impurity region 5 and the upper impurity region 20a may have the same conductivity type. Moreover, the upper impurity region 20a may have a higher impurity concentration than the well impurity region 5.

The lower impurity region 18 may have a different conductivity type from the well impurity region 5 and the upper impurity region 20a. For example, the well impurity region 5 and the upper impurity region 20a may be a P-type, and the lower impurity region 18 may be an N-type. The lower impurity region 18 and the upper impurity region 20a may have different conductivity types from each other, and may constitute a vertical PN diode.

The lower impurity region 18 may be formed of a first impurity region 10 and a second impurity region 15 having different impurity concentrations. The first impurity region 10 may have a higher impurity concentration than the second impurity region 15. The second impurity region 15 may be interposed between the first impurity region 10 and the upper impurity region 20a.

The well impurity region 5 may be formed in the semiconductor substrate 1 below the lower semiconductor patterns 40, and may extend into the lower semiconductor patterns 40. That is, the well impurity region 5 may be formed in the semiconductor substrate 1 between the lower semiconductor patterns 40, and may be formed in a lower region of the lower semiconductor patterns 40.

The lower impurity region 18 may be formed in the remaining region of the lower semiconductor patterns 40, in which the well impurity region 5 is not formed, and a part thereof may extend into the upper semiconductor patterns 45. Moreover, in the upper semiconductor patterns 45, the upper impurity region 20a may be formed in the remaining region of the upper semiconductor patterns 45, in which the lower impurity region 18 is not formed.

The upper impurity region 20a and the lower impurity region 18 may constitute a vertical diode D. Also, the first impurity regions 10 in the lower impurity regions 18 may constitute word lines WL1, WL2, . . . , WLm.

According to embodiments of the inventive concept, a process performed at a high temperature such as, for example, a selective epitaxial growth (SEG) process is not performed to form a vertical diode D. Therefore, according to the embodiments of the inventive concept, the vertical diode D may be formed without using a high-temperature process, and thus deterioration of a semiconductor substrate caused when performing a high-temperature process may be prevented.

An isolation layer 60 filling spaces between the lower semiconductor patterns 40 and between the upper semiconductor patterns 45 may be provided. The isolation layer 60 may be formed of, for example, a silicon oxide-based insulating material. A buffer insulating pattern 55 covering a sidewall and a bottom surface of the isolation layer 60 may be provided. That is, the buffer insulating pattern 55 may be interposed between the isolation layer 60 and the upper and lower semiconductor patterns 45 and 40, and may be interposed between the isolation layer 60 and the semiconductor substrate 1.

A first interlayer insulating layer 65 may be provided on the semiconductor substrate 1 having the isolation layer 60. The first interlayer insulating layer 65 may be, for example, a silicon oxide layer. Metal plugs 75 penetrating the first interlayer insulating layer 65 and electrically connected to the upper impurity regions 20a may be provided. The metal plugs 75 may be formed of a metal such as, for example, tungsten, titanium or tantalum. Meanwhile, the metal plugs 75 and the upper impurity regions 20a may be electrically connected to each other through metal-semiconductor compound layers 70. The metal-semiconductor compound layers 70 may be interposed between the metal plugs 75 and the upper impurity regions 20a, and may be formed of one of, for example, cobalt silicide, titanium silicide and nickel silicide.

A second interlayer insulating layer 80 covering the metal plugs 75 may be provided on the first interlayer insulating layer 65. The second interlayer insulating layer 80 may be, for example, a silicon oxide layer.

First conductive patterns 85 penetrating the second interlayer insulating layer 80 and electrically connected to the metal plugs 75 may be provided. The first conductive patterns 85 may be formed of one selected from the group consisting of, for example, a titanium (Ti) layer, a silicon (Si) layer, a tantalum (Ta) layer, a molybdenum (Mo) layer, a tungsten (W) layer, a ruthenium (Ru) layer, a titanium tungsten (TiW) layer, a titanium nitride (TiN) layer, a titanium oxynitride (TiON) layer, a titanium aluminum nitride (TiAlN) layer, a titanium aluminum oxynitride (TiAlON) layer, a titanium silicon nitride (TiSiN) layer, a titanium boron nitride (TiBN) layer, a tungsten nitride (WN) layer, a tungsten oxynitride (WON) layer, a tungsten silicon nitride (WSiN) layer, a tungsten boron nitride (WBN) layer, a tungsten cyanide (WCN) layer, a tantalum nitride (TaN) layer, a tantalum oxynitride (TaON) layer, a tantalum aluminum nitride (TaAlN) layer, a tantalum silicon nitride (TaSiN) layer, a tantalum cyanide (TaCN) layer, a molybdenum nitride (MoN) layer, a molybdenum silicon nitride (MoSiN) layer, a molybdenum aluminum nitride (MoAlN) layer, a niobium nitride (NbN) layer, a zirconium nitride silicide (ZrSiN) layer, a zirconium aluminum nitride (ZrAlN) layer, a titanium carbide (TiC) layer, a titanium cyanide (TiCN) layer, a titanium silicide (TiSi) layer, a tantalum silicide (TaSi) layer, a cobalt silicide (CoSi) layer, a nickel silicide (NiSi) layer, a conductive carbon group layer, a copper (Cu) group layer, and a combination thereof.

Information storage patterns 90 and second conductive patterns 93, which are sequentially stacked, may be provided on the substrate 1 having the first conductive patterns 85. The information storage patterns 90 may include a phase-change material layer whose resistance to a flowing current varies depending on a phase. The phase-change material layer may be formed of a material layer including at least one of, for example, tellurium (Te), selenium (Se), germanium (Ge), antimony (Sb), bismuth (Bi), lead (Pb), tin (Sn), silver (Ag), arsenic (As), sulfur (S), silicon (Si), phosphorus (P), oxygen (O) and carbon (c). For example, the phase-change material layer may be used for a phase-change memory cell in addition to a chalcogenide layer such as, for example, a Ge2Sb2Te5 (GST) layer. The second conductive patterns 93 may be formed of one selected from the group consisting of, for example, a Ti layer, a Si layer, a Ta layer, a Mo layer, a W layer, a Ru layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and a combination thereof.

In some embodiments of the inventive concept, the information storage patterns 90 may be formed in the shape of lines spaced apart from each other. For example, viewed from a plan view, the information storage patterns 90 may be formed in the shape of lines having a second orientation Y crossing the lower semiconductor patterns 40 of the first orientation X. Alternatively, the information storage patterns 90 may be spaced apart from each other to be formed in an island type.

The information storage patterns 90 may be electrically connected to the diodes D through the first conductive patterns 85, the metal plugs 75 and the metal-semiconductor compound layers 70.

Conductive lines 96 may be provided on the second conductive patterns 93. The conductive lines 96 may be defined as bit lines BL1, BL2, . . . , BLn. The conductive lines 96 may be formed of, for example, one selected from the group consisting of a tungsten layer, an aluminum layer, a conductive carbon group layer, a Cu group layer and a combination thereof. Viewed from a plan view, the conductive lines 96 may be formed in the shape of lines having the second orientation Y crossing the lower semiconductor patterns 40 of the first orientation X.

Viewed from a plan view, the information storage patterns 90 disposed at intersections of the first impurity regions 10, corresponding to the word lines WL1, WL2, . . . , WLm, in the lower semiconductor patterns 40, and the conductive lines 96 corresponding to the bit lines BL1, BL2, . . . , BLn may be defined as information storage elements Rp.

Figure 17A:
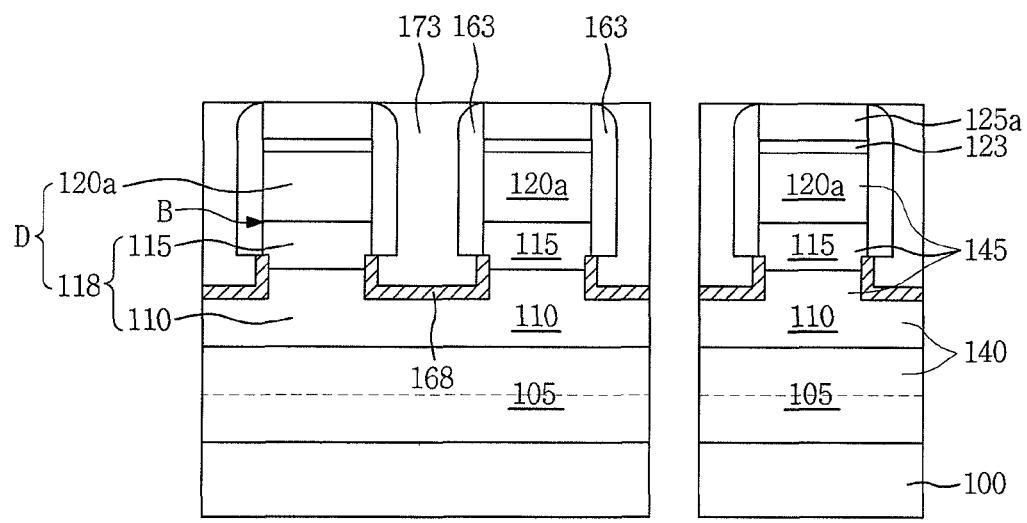
Figure 17B:
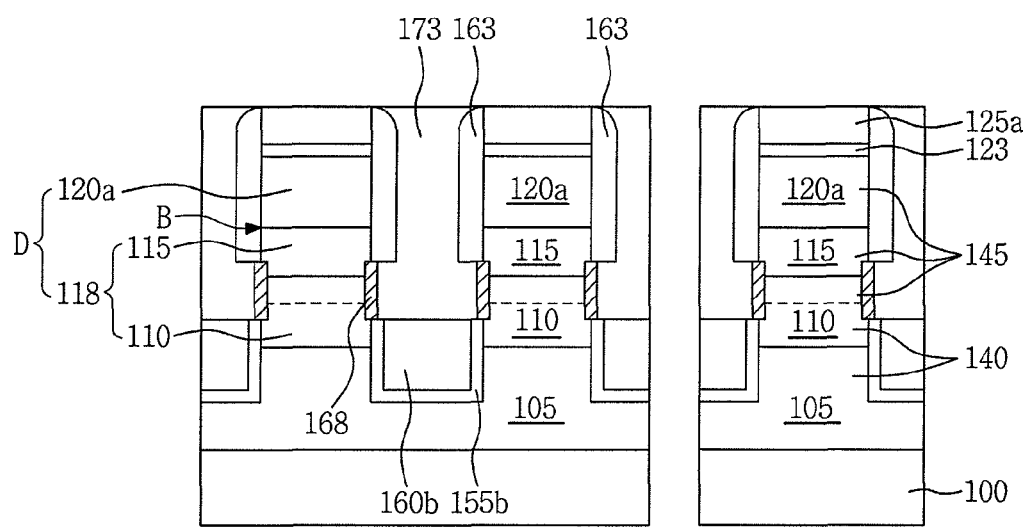

Next, a semiconductor device according to another embodiment of the inventive concept will be described with reference to FIGS. 2, 17A and 17B. In FIGS. 17A and 17B, FIG. 17A is a cross-sectional view of a region taken along line I-I' of FIG. 2, and FIG. 17B is a cross-sectional view of a region taken along line II-II' of FIG. 2.

Referring to FIGS. 2, 17A and 17B, a semiconductor substrate 100 may be provided. The semiconductor substrate 100 may be, for example, a silicon substrate. As illustrated in FIGS. 9A and 9B, a plurality of lower semiconductor patterns 140 spaced apart from each other and upper semiconductor patterns 145 upwardly projecting from top surfaces of the lower semiconductor patterns 140 may be provided on the semiconductor substrate 100. That is, the lower semiconductor patterns 140 and the upper semiconductor patterns 145 may respectively correspond to the lower semiconductor patterns 40 and the upper semiconductor patterns 45 of FIGS. 9A and 9B, and thus detailed descriptions thereof will be omitted.

Also, a well impurity region 105, a lower impurity region 118 and an upper impurity region 120a corresponding to the well impurity region 5, the lower impurity region 18 and the upper impurity region 20a described in FIGS. 9A and 9B, respectively, may be provided.

The lower impurity region 118 may be formed of a first impurity region 110 and a second impurity region 115 that have different impurity concentrations. The first impurity region 110 may have a higher impurity concentration than the second impurity region 115.

The well impurity region 105 may be formed in the semiconductor substrate 100 below the lower semiconductor patterns 140, and may extend into the lower semiconductor patterns 140. The lower impurity region 118 may be formed in the remaining part of the lower semiconductor patterns 140, in which the well impurity region 105 is not formed, and a part thereof may extend into the upper semiconductor patterns 145. Further, the upper impurity region 120a may be formed in the remaining part of the upper semiconductor patterns 145, in which the lower impurity region 118 is not formed.

The upper impurity region 120a and the lower impurity region 118 may constitute a vertical diode D. Moreover, the first impurity regions 110 in the lower impurity regions 118 may constitute word lines WL1, WL2, . . . , WLm.

A lower isolation pattern 160b partially filling spaces between the lower semiconductor patterns 140 may be provided. A buffer insulating pattern 155b covering a sidewall and a bottom surface of the lower isolation pattern 160b may be provided. A structure formed of the lower isolation pattern 160b and the buffer insulating pattern 155b may have a top surface disposed at a higher level than a bottom surface of the lower impurity region 118. That is, the lower isolation pattern 160b and the buffer insulating pattern 155b may have a top surface disposed at a higher level than a bottom surface of the lower impurity region 118. An insulating structure formed of the lower isolation pattern 160b and the buffer insulating pattern 155b may cover from bottom regions between the lower semiconductor patterns 140 to sidewalls of the lower semiconductor patterns 140 disposed at a higher level than the bottom surface of the lower impurity region 118 and disposed at a lower level than a top surface of the first impurity region 110 in the lower impurity region 118.

Sidewall spacers 163 surrounding sidewalls of the upper semiconductor patterns 145 at a boundary region B between the upper impurity region 120a and the lower impurity region 118 may be provided. Each of the sidewall spacers 163 may be spaced apart from another sidewall spacer surrounding a sidewall of an adjacent upper semiconductor pattern.

The sidewall spacers 163 may cover sidewalls of the upper semiconductor patterns 145, on which the upper impurity region 120a is disposed, and may extend towards sidewalls of the upper semiconductor patterns 145, on which the lower impurity region 118 is disposed. Bottom surfaces of the sidewall spacers 163 may be disposed lower than the boundary region B between the upper impurity region 120a and the lower impurity region 118, and may be disposed between a lower part and an upper part of the lower impurity region 118.

The sidewall spacers 163 may be formed of an insulating material having a different etch selectivity from the lower isolation pattern 160b. For example, the lower isolation pattern 160b may be formed of a silicon oxide-based insulating material, and the sidewall spacers 163 may be formed of a silicon nitride-based insulating material, e.g., a silicon nitride layer.

Metal-semiconductor compound layers 168 may be provided on exposed surfaces of the lower semiconductor patterns 140 that are not covered with an insulating structure formed of the sidewall spacers 163, the lower isolation pattern 160b and the buffer insulating pattern 155b and on exposed surfaces of the upper semiconductor patterns 145. The metal-semiconductor compound layers 168 may be formed to be spaced apart from the well impurity region 105 in the lower semiconductor patterns 140. That is, the metal-semiconductor compound layers 168 may be disposed at a higher level than the well impurity region 105. Further, the metal-semiconductor compound layers 168 may be disposed at a lower level than the upper impurity region 120a.

Therefore, the metal-semiconductor compound layers 168 may cover sidewalls of the lower semiconductor patterns 140 that are not covered with the insulating structure formed of the lower isolation pattern 160b and the buffer insulating pattern 155b, and top surfaces of the lower semiconductor patterns 140 disposed between the upper semiconductor patterns 145. Furthermore, the metal-semiconductor compound layers 168 may cover a part of sidewalls of the upper semiconductor patterns 145. Here, the metal-semiconductor compound layers 168 may be spaced apart from the upper impurity regions 120a to be electrically insulated therefrom. The metal-semiconductor compound layers 168 and the lower impurity regions 118 may form an ohmic contact.

Therefore, the metal-semiconductor compound layers 168 may improve electrical characteristics of the word lines WL1, WL2, . . . , WLm. That is, word lines formed of the metal-semiconductor compound layers 168 and the first impurity regions 110 may exhibit better electrical characteristics than word lines formed of only the first impurity regions 110. This is because the metal-semiconductor compound layers 168 and the first impurity regions 110 form an ohmic contact, and electrical characteristics of the metal-semiconductor compound layers 168 may be superior to those of the first impurity regions 110.

While it is not illustrated in the drawings, the metal plugs 75, the first conductive patterns 85, the information storage patterns 90, the second conductive patterns 93 and the conductive lines 96 described in FIGS. 9A and 9B may be provided on the results. Here, the conductive lines 96 may be bit lines BL1, BL2, . . . , BLn.

Methods of fabricating a semiconductor device according to embodiments of the inventive concept will be described.

First, a method of fabricating a semiconductor device according to an embodiment of the inventive concept will be described below with reference to FIGS. 3A to 9B.

Figure 3A:
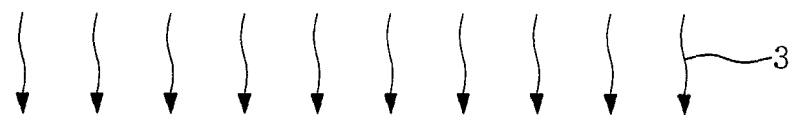
FIGS. 3A, 4A, 5A, 6A, 7A, 8A, and 9A are cross-sectional views taken along line I-I' of FIG. 2, illustrating a method of fabricating a semiconductor device according to an exemplary embodiment of the inventive concept.
Figure 3B:
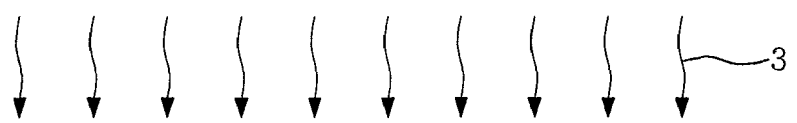
FIGS. 3B, 4B, 5B, 6B, 7B, 8B, and 9B are cross-sectional views taken along line II-II' of FIG. 2, illustrating a method of fabricating a semiconductor device according to an exemplary embodiment of the inventive concept.
Figure 3B:
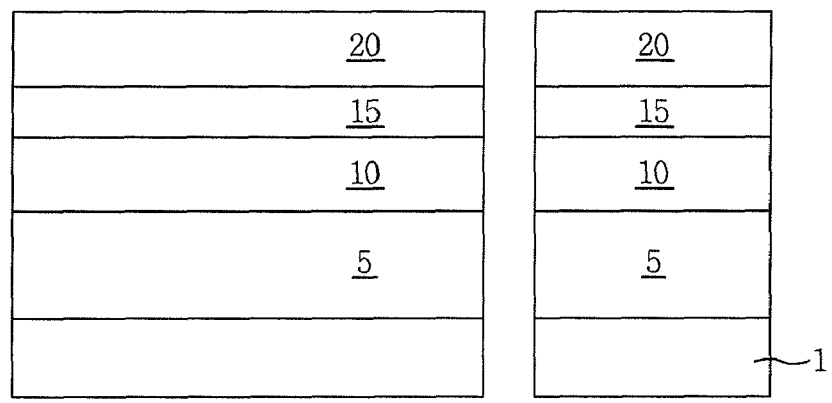

Referring to FIGS. 2, 3A and 3B, a semiconductor substrate 1 may be prepared. The semiconductor substrate 1 may be, for example, a silicon substrate. An ion implantation process 3 may be performed to form a well impurity region 5, a first impurity region 10, a second impurity region 15 and a third impurity region 20 in the semiconductor substrate 1. The well impurity region 5, the first impurity region 10, the second impurity region 15 and the third impurity region 20 may be formed to be sequentially stacked.

The first and second impurity regions 10 and 15 may have a first conductivity type, and the well impurity region 5 and the third impurity region 20 may have a second conductivity type different from the first conductivity type. For example, the first conductivity type may be an N-type, and the second conductivity type may be a P-type.

In some embodiments of the inventive concept, when the semiconductor substrate 1 is a P-type substrate, formation of the well impurity region 5 may be omitted.

The first impurity region 10 may have a higher impurity concentration than the second impurity region 15. The third impurity region 20 may have a higher impurity concentration than the well impurity region 5.

Figure 4A:
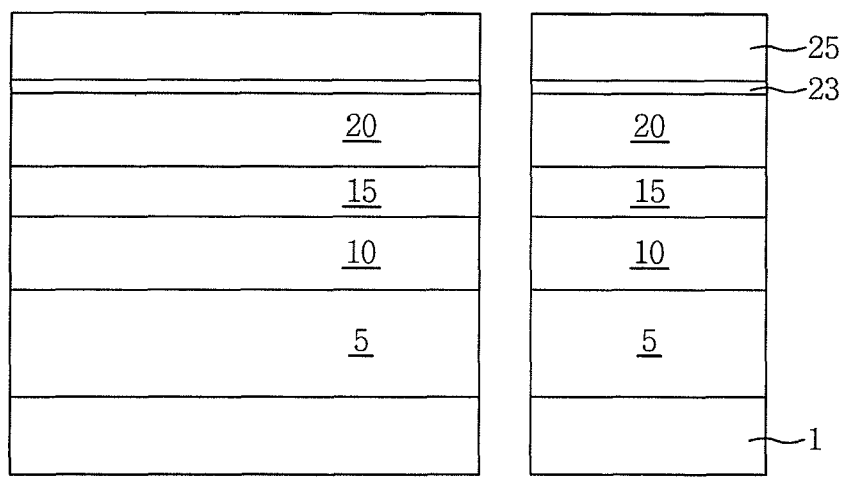
Figure 4B:
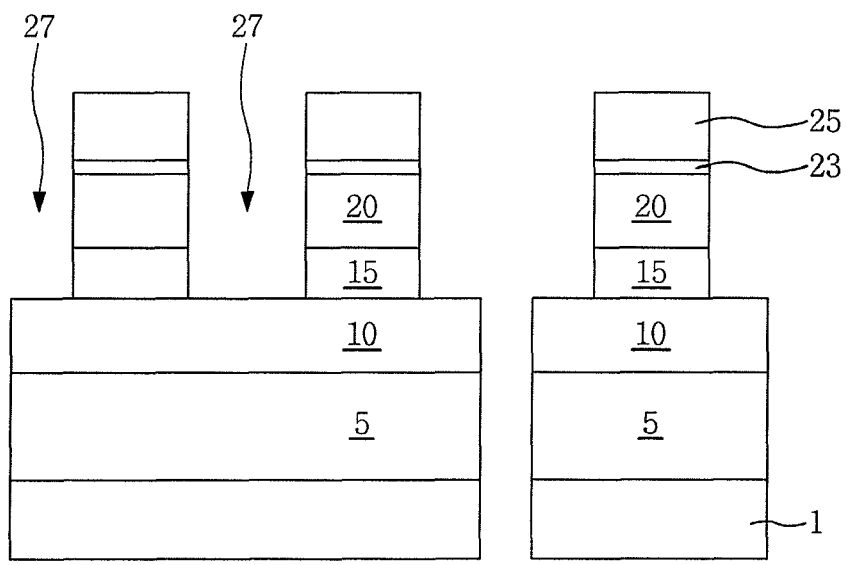

Referring to FIGS. 2, 4A and 4B, a pad oxide layer 23 and a hard mask 25 may be sequentially formed on the semiconductor substrate 1 having the first to third impurity regions 10, 15 and 20. The pad oxide layer 23 may be formed of, for example, a thermal oxide layer, and the hard mask 25 may be formed of a material layer such as, for example, silicon nitride (SiN). The hard mask 25 may be formed, for example, in the shape of a plurality of lines having a first orientation and spaced apart from each other.

Then, an etching process may be performed using the hard mask 25 as an etch mask, so that a preliminary trench 27 having a bottom region at a lower level than the third impurity region 20 in the semiconductor substrate 1 may be formed.

Figure 5A:
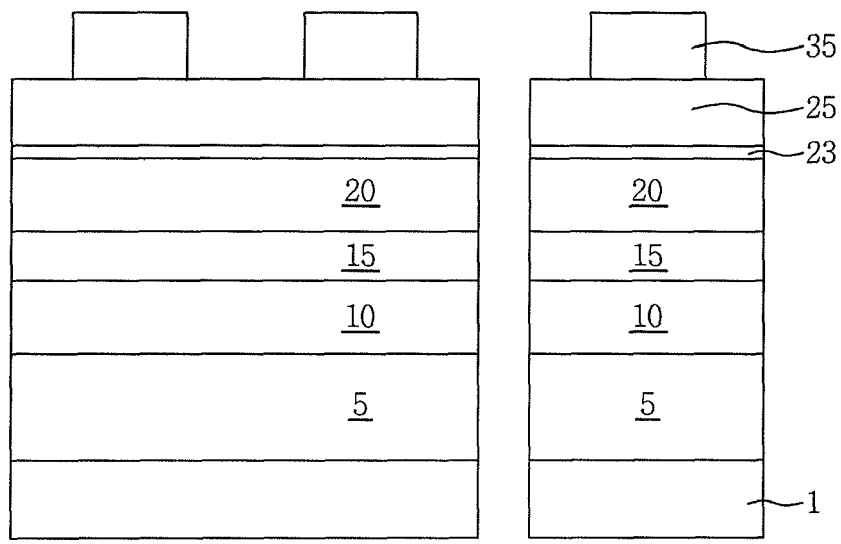
Figure 5B:
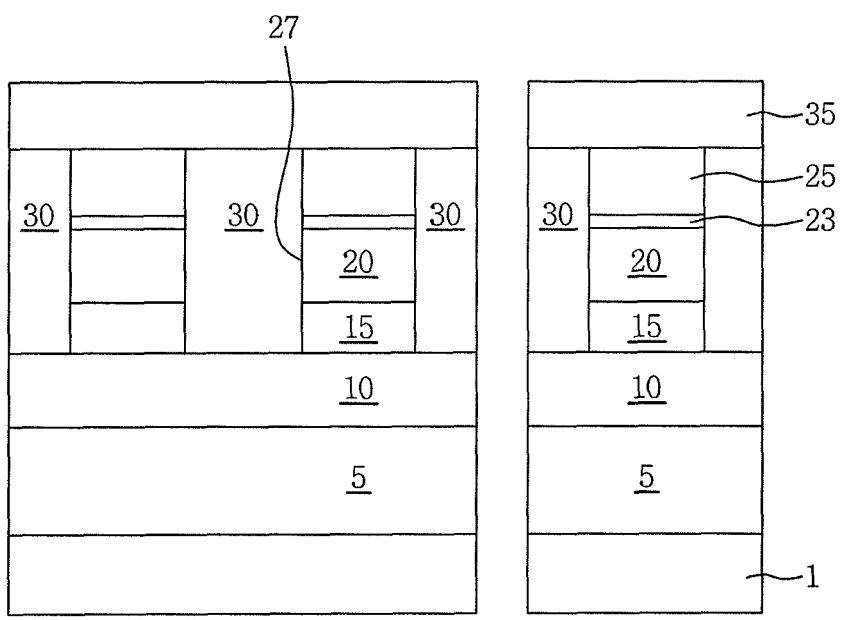

Referring to FIGS. 2, 5A and 5B, a sacrificial layer 30 filling the preliminary trench 27 may be formed. The sacrificial layer 30 may be formed of, for example, a silicon oxide layer using a spin coating method. The sacrificial layer 30 may be formed to have a planar top surface.

A sacrificial mask 35 having an orientation Y crossing the hard mask 25 may be formed on the semiconductor substrate 1 having the sacrificial layer 30. That is, the hard mask 25 may be formed in the shape of lines having a first orientation X, and the sacrificial mask 35 may be formed in the shape of lines having a second orientation Y crossing the first orientation X. The sacrificial mask 35 may be formed of a material such as, for example, silicon oxynitride (SiON).

Figure 6A:
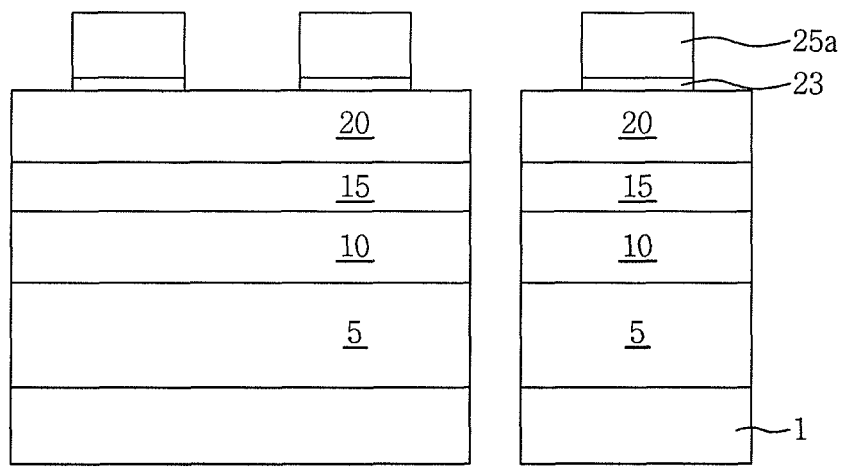
Figure 6B:
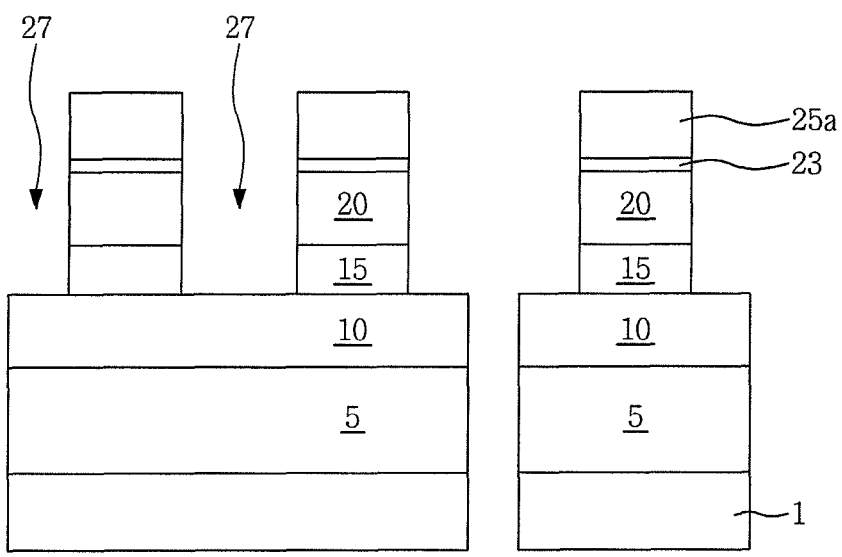

Referring to FIGS. 2, 6A and 6B, the hard mask 25 may be etched using the sacrificial mask 35 as an etch mask to form hard mask patterns 25a. Afterwards, the sacrificial mask 35 and the sacrificial layer 30 may be removed.

Figure 7A:
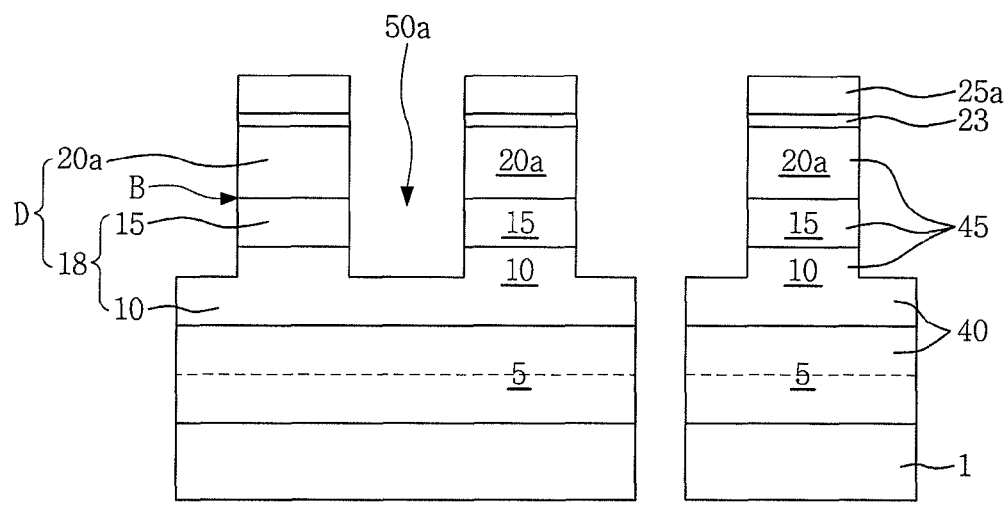
Figure 7B:
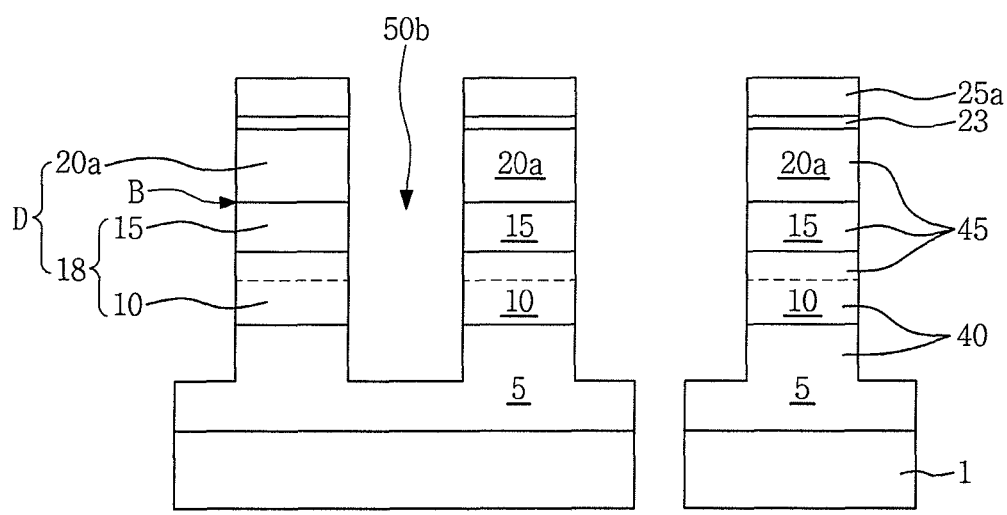

Referring to FIGS. 2, 7A and 7B, the semiconductor substrate 1 may be etched using the hard mask patterns 25a as etch masks to form lower semiconductor patterns 40 and upper semiconductor patterns 45 upwardly projecting from predetermined regions of the lower semiconductor patterns 40. The lower semiconductor patterns 40 may be in the shape of lines spaced apart from each other. Therefore, a first space 50a may be formed between the upper semiconductor patterns 45 projecting from the lower semiconductor patterns 40, and a second space 50b may be formed between the lower semiconductor patterns 40. As the lower and upper semiconductor patterns 40 and 45 are formed by etching the semiconductor substrate 1, the semiconductor substrate 1 and the lower and upper semiconductor patterns 40 and 45 may be formed as a serially and integrally connected structure.

The lower semiconductor patterns 40 may be aimed in the shape of lines having the first orientation X. The upper semiconductor patterns 45 may project from predetermined regions of the lower semiconductor patterns 40. A plurality of upper semiconductor patterns 45 spaced apart from each other may project from the lower semiconductor patterns 40.

The third impurity region 20 and the second impurity region 15 may remain in the upper semiconductor patterns 45. Further, a part of the first impurity region 10 may remain in the upper semiconductor patterns 45, and the remaining part of the first impurity region 10 may remain in the lower semiconductor patterns 40. The first impurity region 10 may be disposed at a higher level than a bottom region of the lower semiconductor patterns 40. A part of the first impurity region 10 may remain in a part of the lower semiconductor patterns 40, e.g., in upper regions of the lower semiconductor patterns 40, and the remaining part of the first impurity region 10 may remain in the upper semiconductor patterns 45.

The well impurity region 5 may remain in the semiconductor substrate 1 below the lower semiconductor patterns 40, and in a lower region of the lower semiconductor patterns 40. That is, the well impurity region 5 may be formed in the semiconductor substrate 1 below the lower semiconductor patterns 40, and may extend into the lower region of the lower semiconductor patterns 40.

In FIG. 7A, dotted lines illustrated in a central part of the well impurity region 5 represent bottom surfaces of the lower semiconductor patterns 40. In FIG. 7B, dotted lines illustrated in a central part of the first impurity region 10 represent bottom surfaces of the upper semiconductor patterns 45, e.g., a boundary surface between the upper semiconductor patterns 45 and the lower semiconductor patterns 40.

The third impurity regions 20 remaining in the upper semiconductor patterns 45 may be defined as upper impurity regions 20a, and the first and second impurity regions 10 and 15 remaining in the lower semiconductor patterns 40 and the upper semiconductor patterns 45 may be defined as lower impurity regions 18. Therefore, the lower impurity regions 18 and the upper impurity regions 20a may have different conductivity types and may form a PN diode. Here, the lower impurity regions 18 may be formed of the first and second impurity regions 10 and 15 having the same conductivity type and different impurity concentrations, and the second impurity region 15 may have a lower impurity concentration than the first impurity region 10. Meanwhile, a boundary region B between the lower impurity region 18 and the upper impurity region 20a may be disposed in the upper semiconductor pattern 45.

Meanwhile, while the semiconductor substrate 1 is etched, the thickness of the hard mask patterns 25a may be reduced.

The upper impurity region 20a and the lower impurity region 18 may constitute a diode D. Also, the first impurity regions 10 of the lower impurity regions 18 may constitute word lines WL1, WL2, . . . , WLm.

Figure 8A:
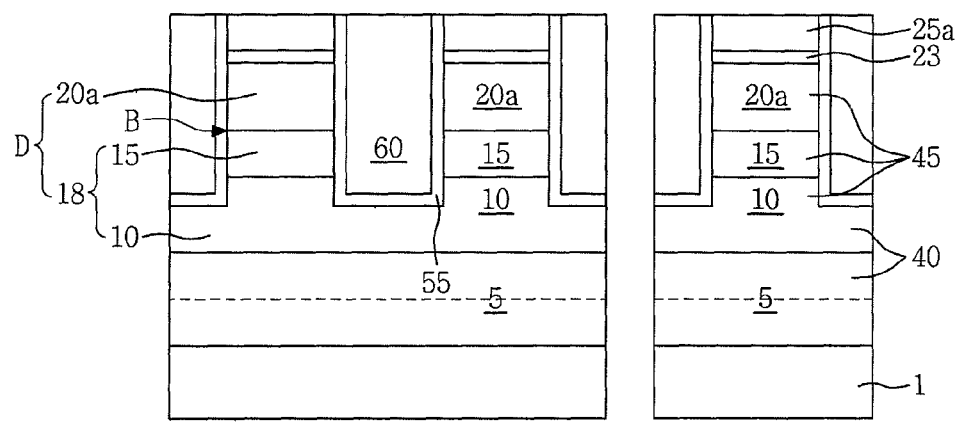
Figure 8B:
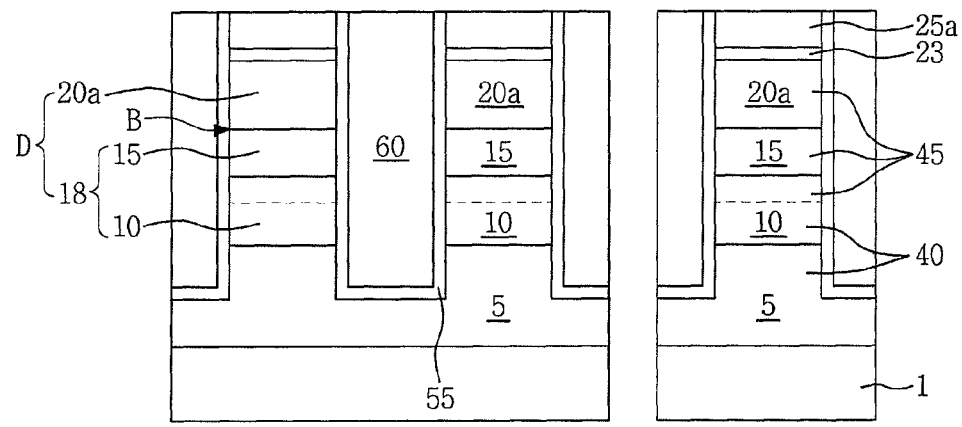

Referring to FIGS. 2, 8A and 8B, an isolation layer 60 filling spaces between the lower semiconductor patterns 40 and between the upper semiconductor patterns 45 may be formed. For example, forming the isolation layer 60 may include forming an insulating layer such as undoped silicate glass (USG) on the semiconductor substrate 1 having the lower semiconductor patterns 40 and the upper semiconductor patterns 45, and planarizing the insulating material layer until the hard mask 25 is exposed.

In some embodiments of the inventive concept, before forming the isolation layer 60, a buffer insulating layer 55 may be formed between the lower semiconductor patterns 40 and on the semiconductor substrate 1 having the upper semiconductor patterns 45. For example, forming the buffer insulating layer 55 may include performing a thermal oxidation process between the lower semiconductor patterns 40 and on the semiconductor substrate 1 having the upper semiconductor patterns 45 to form a thermal oxide layer, and forming an insulating liner having substantially a uniform thickness on the semiconductor substrate 1 having the thermal oxide layer. The insulating liner may be, for example, a silicon oxide layer and/or a silicon nitride layer.

Referring to FIGS. 2, 9A and 9B, a first interlayer insulating layer 65 may be formed on the semiconductor substrate 1 having the isolation layer 60. The first interlayer insulating layer 65 may be formed of, for example, a silicon oxide layer.

Holes 65h penetrating the first interlayer insulating layer 65 and the hard mask patterns 25a and exposing the upper impurity regions 20a may be formed. Meanwhile, while the holes 65h are formed, the hard mask patterns 25a may be removed. Then, metal plugs 75 filling the holes 65h may be formed. The metal plugs 75 may be foamed of a metal such as, for example, tungsten, titanium or tantalum. Meanwhile, before forming the metal plugs 75, a silicide process may be performed to form a metal-semiconductor compound layer 70 on the upper impurity regions 20a. The metal-semiconductor compound layer 70 may be formed of, for example, one of cobalt silicide, titanium silicide, and nickel silicide.

A second interlayer insulating layer 80 may be formed on the semiconductor substrate 1 having the metal plugs 75. The second interlayer insulating layer 80 may be formed of, for example, a silicon oxide layer.

First conductive patterns 85 penetrating the second interlayer insulating layer 80 and electrically connected to the metal plugs 75 may be formed. The first conductive patterns 85 may be formed of one selected from the group consisting of, for example, a Ti layer, a Si layer, a Ta layer, a Mo layer, a W layer, a Ru layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and a combination thereof.

In some embodiments of the inventive concept, forming the first conductive patterns 85 may include forming holes penetrating the second interlayer insulating layer 80 and exposing the metal plugs 75, forming a conformal electrode layer covering inner walls of the holes and the second interlayer insulating layer 80 on the substrate, forming an insulating material layer filling the holes on the electrode layer, and planarizing the insulating material layer and the electrode layer until a top surface of the second interlayer insulating layer 80 is exposed. Here, the planarization may be performed using, for example, chemical mechanical polishing (CMP) and/or etch-back. Meanwhile, insulating patterns 87 filling the holes may be formed on the first conductive patterns 85.

Information storage patterns 90 and second conductive patterns 93, which are sequentially stacked, may be formed on the substrate 1 having the first conductive patterns 85. The information storage patterns 90 may include a phase-change material layer whose resistance to a flowing current varies depending on a phase. The phase-change layer may be formed of a material layer including, for example, at least one of Te, Se, Ge, Sb, Bi, Pb, Sn, Ag, As, S, Si, P, O and C. For example, the phase-change material layer may be used for a phase-change memory cell in addition to a chalcogenide layer. The second conductive patterns 93 may be formed of, for example, one selected from the group consisting of a Ti layer, a Si layer, a Mo layer, a W layer, a Ru layer, a Ta layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and a combination thereof.

In some embodiments of the inventive concept, the information storage patterns 90 may be formed in the shape of lines spaced apart from each other. For example, viewed from a plan view, the information storage patterns 90 may be formed in the shape of lines having the second orientation Y crossing the lower semiconductor patterns 40 of the first orientation X. Alternatively, the information storage patterns 90 may be spaced apart from each other to be in an island type.

The information storage patterns 90 may be electrically connected to the diodes D through the first conductive patterns 85, the metal plugs 75 and the metal-semiconductor compound layers 70.

Conductive lines 96 may be formed on the second conductive patterns 93. The conductive lines 96 may be formed of, for example, one selected from the group consisting of a tungsten layer, an aluminum layer, a conductive carbon group layer, a Cu group layer and a combination thereof. Viewed from a plan view, the conductive lines 96 may be formed in the shape of lines having the second orientation Y crossing the lower semiconductor patterns 40 of the first orientation X.

Viewed from a plan view, the information storage patterns 90 disposed at intersections of the first impurity regions 10, corresponding to the word lines WL1, WL2, . . . , WLm, in the lower semiconductor patterns 40 and the conductive lines 96 corresponding to the bit lines BL1, BL2, . . . , BLn may be defined as information storage elements Rp.

Next, a method of fabricating a semiconductor device according to another embodiment of the inventive concept will be described below with reference to FIGS. 10A to 12B.

Figure 10A:
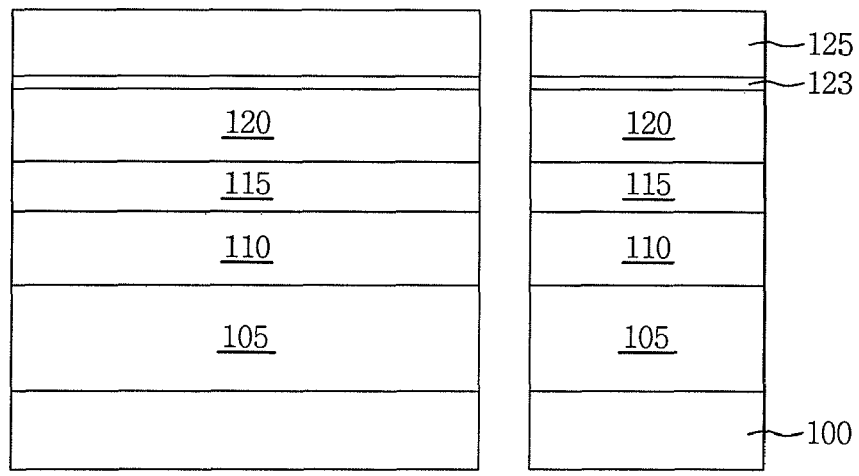
FIGS. 10A, 11A, 12A, and 13A are cross-sectional views taken along line I-I' of FIG. 2, illustrating a method of fabricating a semiconductor device according to an exemplary embodiment of the inventive concept.
Figure 10B:
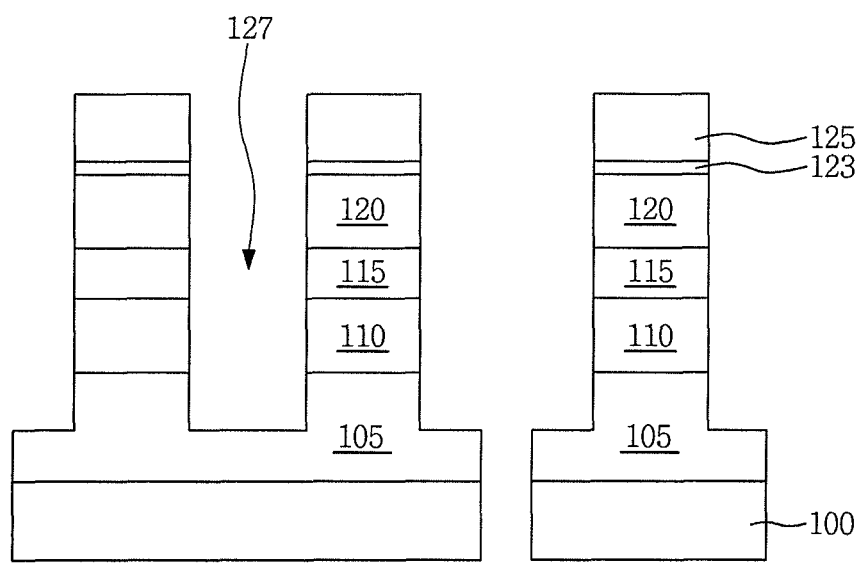
FIGS. 10B, 11B, 12B, and 13B are cross-sectional views taken along line II-II' of FIG. 2, illustrating a method of fabricating a semiconductor device according to an exemplary embodiment of the inventive concept.

Referring to FIGS. 2, 10A and 10B, a well impurity region 105, a first impurity region 110, a second impurity region 115 and a third impurity region 120 may be formed in a semiconductor substrate 100 as described with reference to FIGS. 3A and 3B. The well impurity region 105, the first impurity region 110, the second impurity region 115 and the third impurity region 120 may be formed to be sequentially stacked.

The first and second impurity regions 110 and 115 may have a first conductivity type, and the well impurity region 105 and the third impurity region 120 may have a second conductivity type different from the first conductivity type. For example, the first conductivity type may be an N-type, and the second conductivity type may be a P-type. The first impurity region 110 may have a higher impurity concentration than the second impurity region 115. The third impurity region 120 may have a higher impurity concentration than the well impurity region 105.

A pad oxide layer 123 and a hard mask 125 may be sequentially formed on the semiconductor substrate 100 having the first to third impurity regions 110, 115 and 120. The pad oxide layer 123 may be formed of, for example, a thermal oxide layer, and the hard mask 125 may be formed of a material layer such as, for example, SiN. The hard mask 125 may be formed in the shape of a plurality of lines having a first orientation X and spaced apart from each other.

Then, an etching process may be performed using the hard mask 125 as an etch mask, so that trenches 127 having bottom regions at a lower level than the first impurity region 110 in the semiconductor substrate 100 may be formed. Therefore, the trenches 127 may enable a plurality of semiconductor patterns spaced apart from each other to be formed. The first to third impurity regions 110, 115 and 120 may remain in the semiconductor patterns.

Figure 11A:
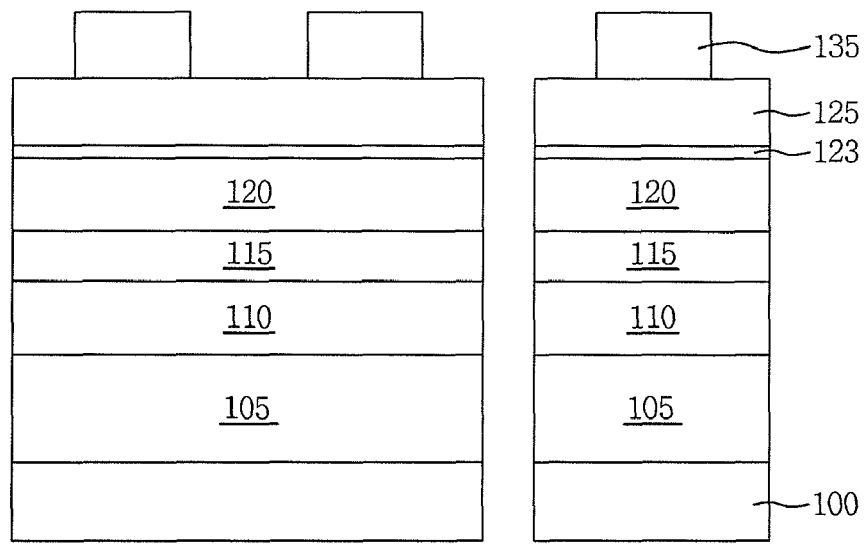
Figure 11B:
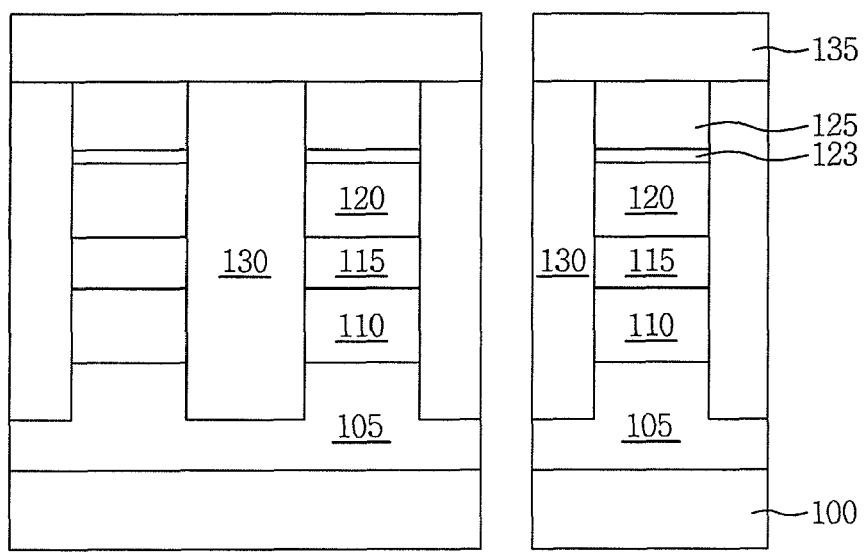

Referring to FIGS. 2, 11A and 11B, a sacrificial layer 130 filling spaces between the trenches 127 may be formed. A sacrificial mask 135 having a second orientation Y crossing the hard mask 125 of the first orientation X may be formed on the substrate having the sacrificial layer 130. The sacrificial mask 135 may be formed of a material such as, for example, SiON.

Figure 12A:
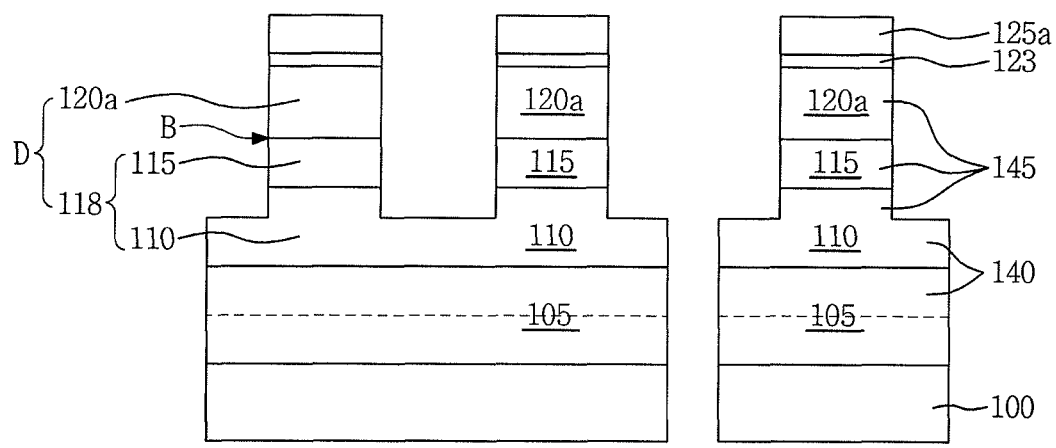
Figure 12B:
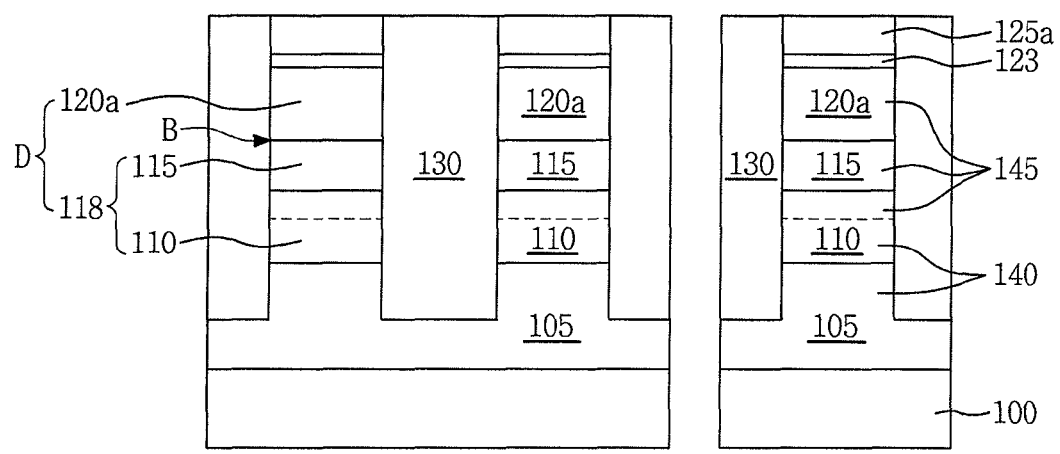

Referring to FIGS. 2, 12A and 12B, the hard mask 125 may be etched using the sacrificial mask 135 as an etch mask. As a result, hard mask patterns 125a spaced apart from each other may be formed.

The semiconductor substrate 100 may be etched using the sacrificial mask 135, the hard mask patterns 125a and the sacrificial layer 130 as etch masks. Here, the etch depth of the semiconductor substrate 100 may be disposed at a lower level than the third impurity region 120, and may be disposed at a higher level than the well impurity region 105. For example, the etch depth of the semiconductor substrate 100 may be disposed at a lower level than the third and second impurity regions 120 and 115, may expose the first impurity region 110, and may be disposed at a higher level than the well impurity region 105.

Therefore, lower semiconductor patterns 140 spaced apart from each other and upper semiconductor patterns 145 upwardly projecting from predetermined regions of the lower semiconductor patterns 140 may be formed in the semiconductor substrate 100. The lower semiconductor patterns 140 and the upper semiconductor patterns 145 may respectively correspond to the lower semiconductor patterns 40 and the upper semiconductor patterns 45 described with reference to FIGS. 7A and 7B. That is, the lower semiconductor patterns 140 may be formed in the shape of lines having the first orientation X. The upper semiconductor patterns 145 may be formed to project from predetermined regions of the lower semiconductor patterns 140. A plurality of upper semiconductor patterns 145 spaced apart from each other may project from one lower semiconductor pattern 140.

The third impurity regions 120 and the second impurity regions 115 may remain in the upper semiconductor patterns 145. Further, a part of the first impurity region 110 may remain in the upper semiconductor patterns 145, and the remaining part of the first impurity region 110 may remain in the lower semiconductor patterns 140. The first impurity region 110 may be disposed at a higher level than a bottom region of the lower semiconductor patterns 140. The first impurity region 110 may remain in a part of the lower semiconductor patterns 140, e.g., upper regions of the lower semiconductor patterns 140, and the remaining part of the first impurity region 110 may remain in the upper semiconductor patterns 145.

The third impurity regions 120 remaining in the upper semiconductor patterns 145 may be defined as upper impurity regions 120a, and the first and second impurity regions 110 and 115 remaining in the lower semiconductor patterns 140 and the upper semiconductor patterns 145 may be defined as lower impurity regions 118. Therefore, the lower impurity region 118 and the upper impurity region 120a may have different conductivity types and may form a PN diode. Here, the lower impurity region 118 may be formed of the first and second impurity regions 110 and 115 having the same conductivity type and different impurity concentrations, and the second impurity region 115 may have a lower impurity concentration than the first impurity region 110. Meanwhile, a boundary region B between the lower impurity region 118 and the upper impurity region 120a may be disposed in the upper semiconductor pattern 145.

The upper impurity region 120a and the lower impurity region 118 may constitute a diode D. Also, the first impurity regions 110 of the lower impurity regions 118 may constitute word lines WL1, WL2, . . . , WLm.

The sacrificial mask 135 may be removed. Meanwhile, the sacrificial mask 135 may be removed while the hard mask patterns 125 are formed and/or the semiconductor substrate 100 is etched.

Figure 13A:
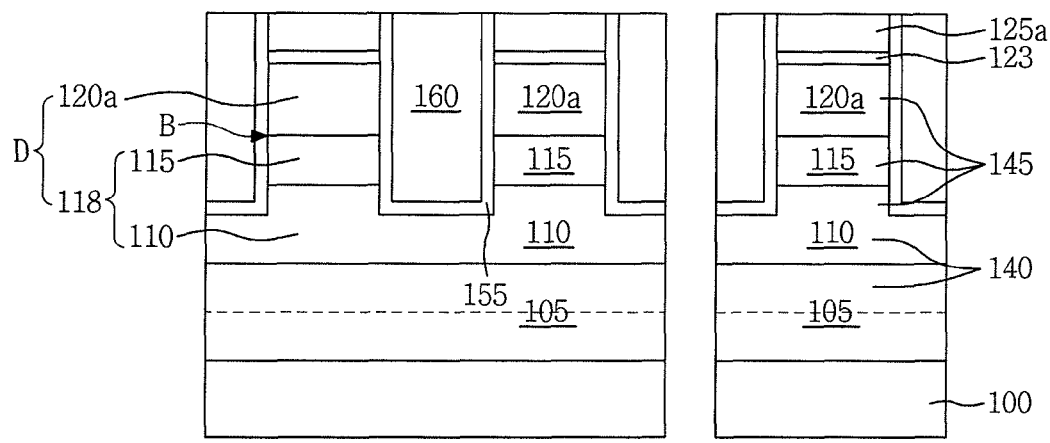
Figure 13B:
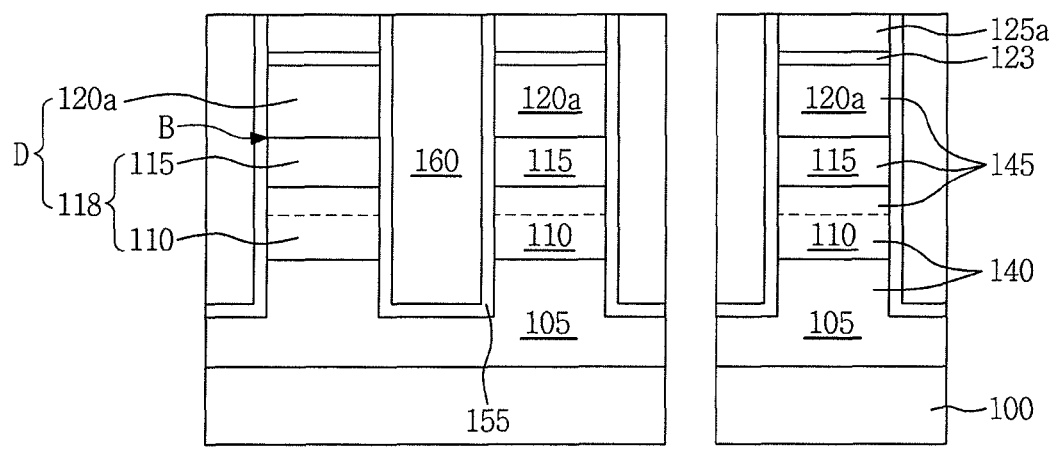

Referring to FIGS. 13A and 13B, the sacrificial layer (130 of FIG. 12B) may be selectively removed. As illustrated in FIGS. 8A and 8B, an isolation layer 160 filling spaces between the lower semiconductor patterns 140 and between the upper semiconductor patterns 145 may be formed.

In some embodiments of the inventive concept, as illustrated in FIGS. 8A and 8B, before forming the isolation layer 160, a buffer insulating layer 155 may be formed between the lower semiconductor patterns 140 and on the semiconductor substrate 100 having the upper semiconductor patterns 145.

As a result, the same structure as illustrated in FIGS. 8A and 8B may be formed. Therefore, while it is not illustrated, an information storage pattern 90 and a bit line 96 as described with reference to FIGS. 9A and 9B may be formed.

The first impurity regions 10 and 110 in the lower impurity regions 18 and 118 described in the previous embodiments of the inventive concept may constitute word lines WL1, WL2, . . . , WLm. Still another embodiment of the inventive concept for enhancing electrical characteristics of the word lines WL1, WL2, . . . , WLm will be described below with reference to FIGS. 14A to 17B.

Figure 14A:
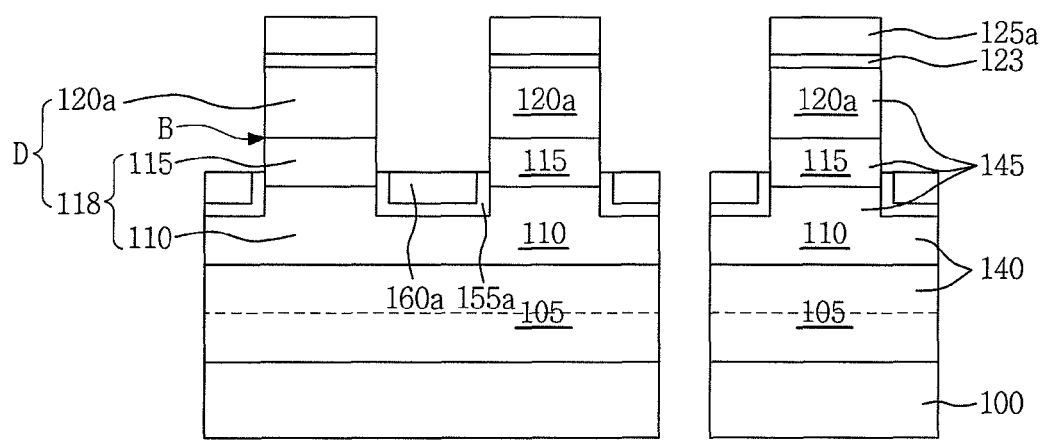
FIGS. 14A, 15A, 16A and 17A are cross-sectional views taken along line I-I' of FIG. 2, illustrating a method of fabricating a semiconductor device according to an exemplary embodiment of the inventive concept.
Figure 14B:
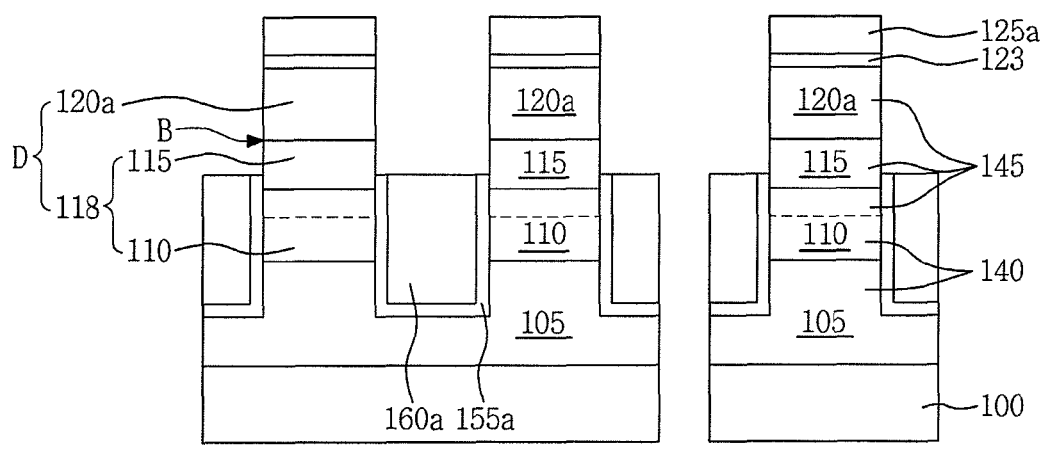
FIGS. 14B, 15B, 16B and 17B are cross-sectional views taken along line II-II' of FIG. 2, illustrating a method of fabricating a semiconductor device according to an exemplary embodiment of the inventive concept.

Referring to FIGS. 2, 14A and 14b, a substrate illustrated in FIGS. 8A and 8B or 13A and 13B may be prepared. Here, the substrate of FIGS. 8A and 8B is substantially the same as that of FIGS. 13A and 13B. Therefore, only the substrate of FIGS. 13A and 13B will be described below.

The isolation layer 160 may be partially etched to expose the boundary region B between the upper impurity region 120a and the lower impurity region 118 in the upper semiconductor patterns 145. As a result, a preliminary isolation pattern 160a may be formed.

In some embodiments of the inventive concept, while the isolation layer 160 is partially etched, a part of the buffer insulating layer 155 may be etched. Therefore, the buffer insulating layer 155 may be interposed between the preliminary isolation pattern 160a and the semiconductor substrate 100 to be formed as a preliminary buffer insulating pattern 155a.

Figure 15A:
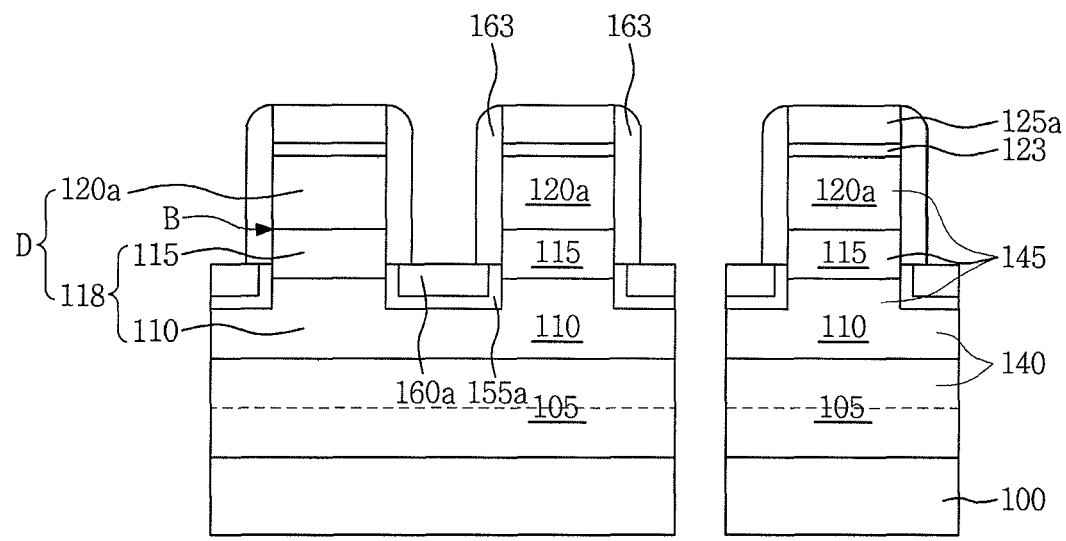
Figure 15B:
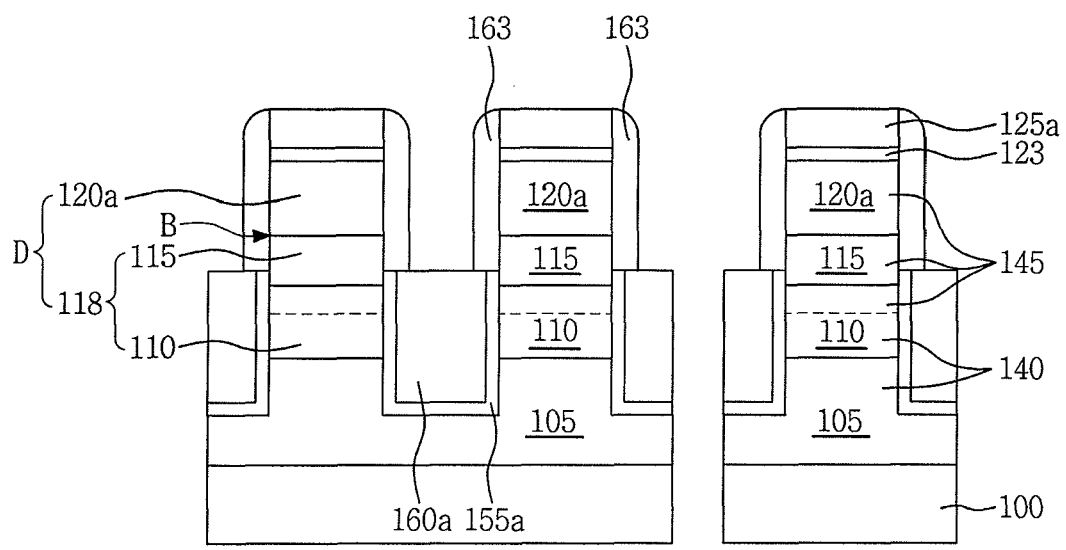

Referring to FIGS. 2, 15A and 15B, sidewall spacers 163 surrounding sidewalls of the upper semiconductor patterns 145 where the boundary region B between the upper impurity region 120a and the lower impurity region 118 is disposed may be formed. The sidewall spacers 163 may be formed of an insulating material having a different etch selectivity from the preliminary isolation pattern 160a. For example, the preliminary isolation pattern 160a may be formed of a silicon oxide-based insulating material, and the sidewall spacers 163 may be formed of a silicon nitride-based insulating material, e.g., a silicon nitride layer.

Each of the sidewall spacers 163 may be spaced apart from another sidewall spacer surrounding a sidewall of an adjacent upper semiconductor pattern.

The sidewall spacers 163 may cover sidewalls of the upper semiconductor pattern 145 where the upper impurity region 120a is disposed, and may extend towards sidewalls of the upper semiconductor pattern 145 where the lower impurity region 118 is disposed. Furthermore, the sidewall spacers 163 may extend to cover sidewalls of the hard mask patterns 125a.

Bottom surfaces of the sidewall spacers 163 may be disposed lower than the boundary region B between the upper impurity region 120a and the lower impurity region 118, and may be disposed between lower and upper parts of the lower impurity region 118.

Figure 16A:
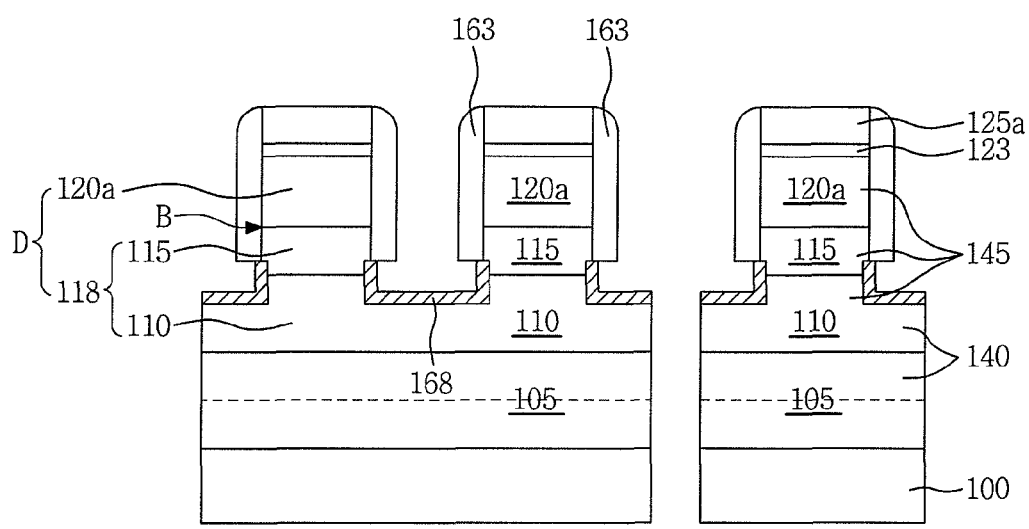
Figure 16B:
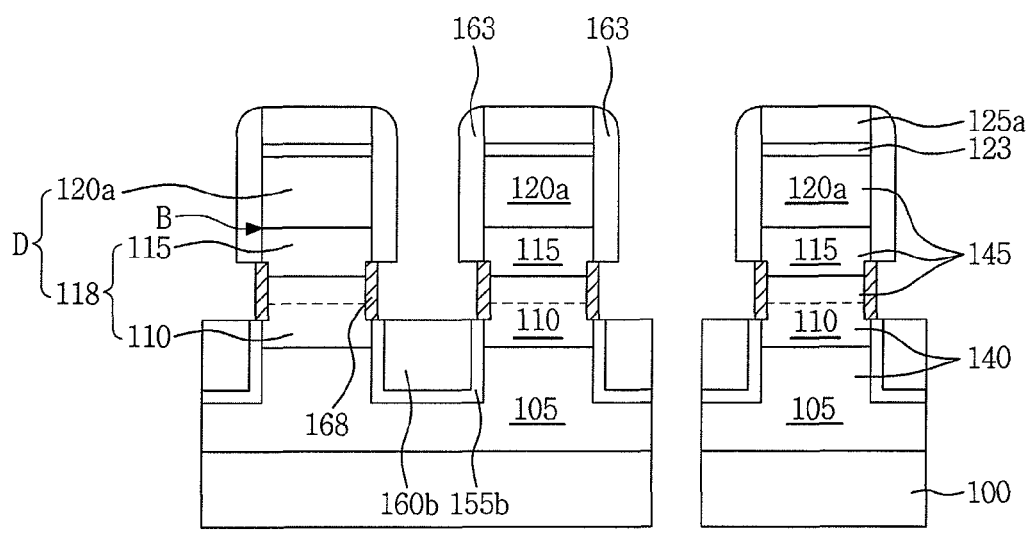

Referring to FIGS. 2, 16A and 16B, the preliminary isolation pattern 160a and the preliminary buffer insulating pattern 155a may be partially etched to expose predetermined regions of the lower semiconductor patterns 140 where the lower impurity region 118 is disposed. The preliminary isolation pattern 160a and the preliminary buffer insulating pattern 155a may be partially etched to form a lower isolation pattern 160b and a buffer insulating pattern 155b. The buffer insulating pattern 155b may be interposed between the lower isolation pattern 160b and the semiconductor substrate 100.

The lower isolation pattern 160b and the buffer insulating pattern 155b may partially fill between the lower semiconductor patterns 140. As a result, predetermined regions of the lower semiconductor patterns 140 where the lower impurity region 118 is disposed may be exposed. The lower isolation pattern 160b and the buffer insulating pattern 155b may have a top surface disposed at a higher level than a bottom surface of the lower impurity region 118. That is, the lower isolation pattern 160b and the buffer insulating pattern 155b may have a top surface disposed at a higher level than a bottom surface of the lower impurity region 118. An insulating structure formed of the lower isolation pattern 160b and the buffer insulating pattern 155b may cover from bottom regions between the lower semiconductor patterns 140 to sidewalls of the lower semiconductor patterns 140 disposed at a higher level than the bottom surface of the lower impurity region 118 and disposed at a lower level than a top surface of the first impurity region 110 in the lower impurity region 118.

Then, a silicide process may be performed. As a result, metal-semiconductor compound layers 168 may be formed on exposed surfaces of the lower semiconductor patterns 140 that are not covered with the insulating structure formed of the sidewall spacers 163, the lower isolation pattern 160b and the buffer insulating pattern 155b and on exposed surfaces of the upper semiconductor patterns 145. The metal-semiconductor compound layers 168 may be formed to be spaced apart from the well impurity region 105 in the lower semiconductor patterns 140. That is, the metal-semiconductor compound layers 168 may be disposed at a higher level than the well impurity region 105. Further, the metal-semiconductor compound layers 168 may be disposed at a lower level than the upper impurity region 120a.

The metal-semiconductor compound layers 168 may improve electrical characteristics of the word lines WL1, WL2, . . . , WLm. That is, word lines formed of the metal-semiconductor compound layers 168 and the first impurity regions 110 may exhibit superior electrical characteristics to word lines formed of only the first impurity regions 110. This is because the metal-semiconductor compound layers 168 and the first impurity regions 110 may form an ohmic contact, and electrical characteristics of the metal-semiconductor compound layers 168 may be superior to those of the first impurity regions 110.

An insulating material layer may be formed on the semiconductor substrate 100 having the metal-semiconductor compound layers 168, and the insulating material layer may be planarized. As a result, an upper isolation layer 173 formed on the insulating structure formed of the lower isolation pattern 160b and the buffer insulating pattern 155b, filling spaces between the lower semiconductor patterns 140 that are not filled with the lower isolation pattern 160b and the buffer insulating pattern 155b, and filling spaces between the upper semiconductor patterns 145 may be formed. The upper isolation layer 173 may be formed of, for example, a silicon oxide-based insulating material. For example, the upper isolation layer 173 may be formed of an insulating material such as a USG layer.

Therefore, the insulating structure formed of the upper isolation layer 173, the lower isolation pattern 160b and the buffer insulating pattern 155b may electrically insulate between the word lines WL1, WL2, . . . , WLm, and electrically insulate between the diodes.

Figure 18:
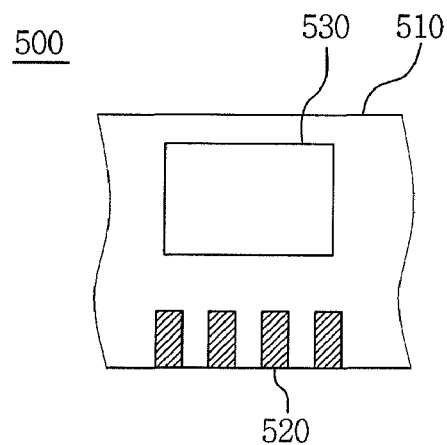
FIG. 18 is a schematic view of a memory card employing a semiconductor device according to an exemplary embodiment of the inventive concept.

FIG. 18 schematically illustrates a memory card. Referring to FIG. 18, a memory card 500 includes a card substrate 510, one or a plurality of semiconductor devices 530 disposed on the card substrate 510, and contact terminals 520 formed side by side at one edge of the card substrate 510 and electrically connected to the semiconductor devices 530, respectively. Here, the semiconductor devices 530 may be formed using a device and/or a method of fabricating the same according to at least one of the above-described embodiments of the inventive concept, and may be a memory chip including an information storage element or a semiconductor package. The memory card 500 may be a memory card used for an electronic device, e.g., a digital camera, a computer, etc.

The card substrate 510 may be, for example, a printed circuit board (PCB). Both surfaces of the card substrate 510 may be used. That is, the semiconductor devices 530 may be disposed on both front and back sides of the card substrate 510. The semiconductor devices 530 may be disposed on a front side and/or a back side of the card substrate 510 to be electrically and mechanically connected thereto.

The contact terminals 520 may be formed of, for example, a metal, and may exhibit oxidation resistance. The contact terminals 520 may be variously set depending on types and standard specifications of the memory card 500. Therefore, the number of contact terminals 520 may not be significant.

Figure 19:
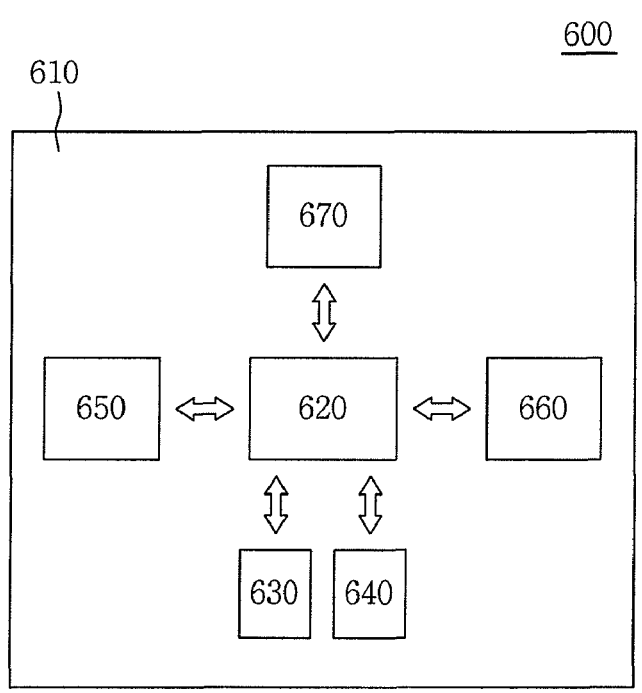
FIG. 19 is a schematic block diagram of an electronic circuit board employing a semiconductor device according to an exemplary embodiment of the inventive concept.

FIG. 19 is a schematic block diagram of an electronic circuit board. Referring to FIG. 19, an electronic circuit board 600 may be provided. The electronic circuit board 600 includes a microprocessor 620 disposed on a circuit board 610, a main storage circuit 630 and a supplementary storage circuit 640 communicating with the microprocessor 620, an input signal processing circuit 650 transmitting a command to the microprocessor 620, an output signal processing circuit 660 receiving a command from the microprocessor 620, and a communicating signal processing circuit 670 transmitting and receiving electrical signals to and from other circuit boards. It may be understood that arrows denote paths through which electrical signals are transmitted.

The microprocessor 620 may receive and process electrical signals, and output the results, and control other elements of the electronic circuit board 610. For example, the microprocessor 620 may be understood as a central processing unit (CPU) and/or a main control unit (MCU). The main storage circuit 630 may temporarily store data that the microprocessor 620 always and frequently requires or data processed or to be processed. As the main storage circuit 630 may require a high-speed response, it may be formed of a semiconductor memory. The main storage circuit 630 may be a semiconductor memory referred to as a cache, and may be formed of, for example, a static random access memory (SRAM), a dynamic random access memory (DRAM), a resistive random access memory (RRAM) and applied semiconductor memories, e.g., utilized RAM, ferro-electric RAM, fast cycle RAM, phase changeable RAM (PRAM), magnetic RAM (MRAM), and other semiconductor memories. In addition, the main storage circuit is not related to volatility/non-volatility, and may include a random access memory.

Therefore, the main storage circuit 630 may include a memory device formed using a device and/or a method of fabricating the same according to at least one of the embodiments of the inventive concept.

The main storage circuit 630 may include, for example, at least one semiconductor module. The supplementary storage circuit 640 may be, for example, a large-capacity memory device, and may be a non-volatile semiconductor memory such as, for example, a flash or phase-change memory or a hard disk drive using a magnetic field. Further, it may be a compact disk drive using light. Compared with the main storage circuit 630, the supplementary storage circuit 640 may not require the high speed, but it may be used when large-capacity data are stored The supplementary storage circuit 640 is not related to randomness/non-randomness, and may include a non-volatile memory device. The supplementary storage circuit 640 may include, for example, at least one semiconductor module. The input signal processing circuit 650 may convert an external command to an electrical signal, and may transmit an electrical signal transmitted from the outside to the microprocessor 620. The externally transmitted command or electrical signal may be, for example, an operating command, an electrical signal to be processed, or data to be stored. For example, input signal processing circuit 650 may be a terminal signal processing circuit processing signals transmitted from a keyboard, a mouse, a touch pad, an image recognition device or various sensors, an image signal processing circuit processing an image signal input from a scanner or a camera, various sensors or an input signal interface.

The output signal processing circuit 660 may be an element for transmitting an electrical signal processed by the microprocessor 620 to the outside. For example, the output signal processing circuit 660 may be a graphic card, an image processor, an optical converter, a beam panel card, or an interface circuit having various functions. The communicating signal processing circuit 670 may be an element for directly transmitting or receiving an electrical signal to or from another electronic system or another circuit board without the input signal processing circuit 650 or the output signal processing circuit 660. For example, the communicating signal processing circuit 670 may be a modem of a personal computer system, a LAN card or various interface circuits.

Figure 20:
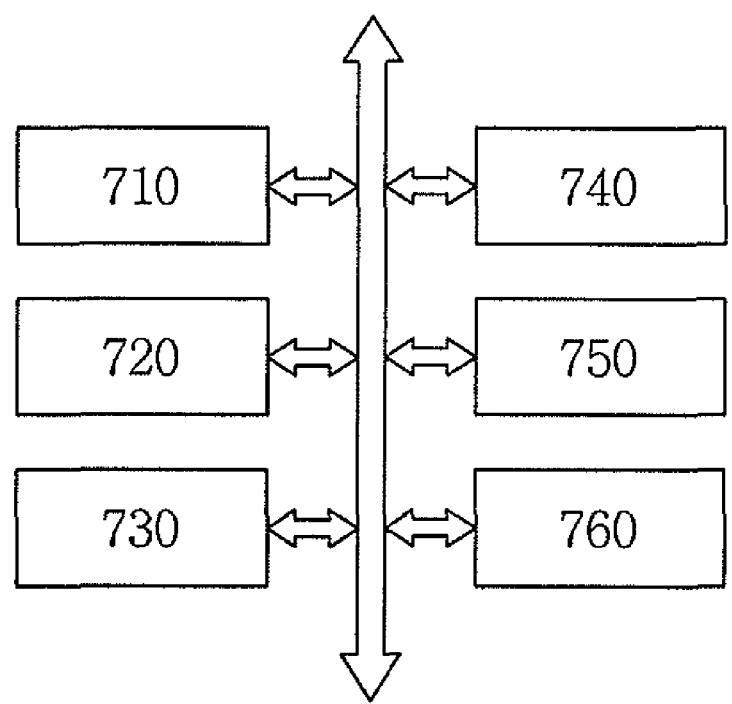
FIG. 20 is a schematic block diagram of an electronic system employing a semiconductor device according to an exemplary embodiment of the inventive concept.

FIG. 20 is a schematic block diagram of an electronic system. Referring to FIG. 20, an electronic system 700 may include a control unit 710, an input unit 720, an output unit 730, and a storage unit 740, and may further include a communication unit 750 and/or an operation unit 760.

The control unit 710 may generally control the electronic system 700 and each part. The control unit 710 may be interpreted as a central processing unit or a central control unit, and may include the electronic circuit board 600. The input unit 720 may transmit an electrical command signal to the control unit 710. The input unit 720 may be an image recognition device such as, for example, a keyboard, a mouse, a touch pad or various input sensors. The output unit 730 may output results that are processed by the electronic system 700 after receiving an electric command signal from the control unit 710. The output unit 730 may be, for example, a monitor, a printer, a beam radiator or various mechanical devices. The storage unit 740 may be an element for temporarily or permanently storing an electrical signal processed or to be processed by the control unit 710. The storage unit 740 may be physically or electrically connected to or combined with the control unit 710. The storage unit 740 may be, for example, a semiconductor memory, a magnetic storage device such as a hard disk, an optical device such as a compact disk or a server functioning to store other data. The storage unit 740 may be, for example, a semiconductor memory that is formed using a device and/or a method of fabricating the same according to at least one of the embodiments of the inventive concept.

The communication unit 750 may receive an electronic command signal from the control unit 710 and transmit it to another electronic system or receive one therefrom. The communication unit 750 may be, for example, a wired transceiver such as a modem and a LAN card, a wireless transceiver such as a Wibro interface or an infrared port. The operation unit 760 may physically or mechanically operate depending on a command of the control unit 710. For example, the operation unit 760 may be an element that mechanically operates such as a floater, an indicator, an up/down operator, etc. The electronic system according to the inventive disclosure may be, for example, a computer, a network, a server, a networking printer or scanner, a wireless controller, a portable communication terminal, an exchanger or another electronic product that performs programmed operations.

Names and functions of elements whose reference marks are not indicated may be readily understood with reference to other drawings of the specification and the descriptions thereof.

According to embodiments of the inventive concept, a vertical diode as a switching device can be formed without using a selective epitaxial growth (SEG) process. Accordingly, degradation of a semiconductor substrate due to the selective epitaxial growth (SEG) process performed at a high temperature can be prevented. The electrical characteristics can also be improved by forming metal-semiconductor compounds in an N-type high-concentration impurity region having a line shape serving as a word line in a memory device.

The foregoing is illustrative of embodiments and is not to be construed as limiting thereof Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:

forming a well impurity region, a lower impurity region and an upper impurity region in a semiconductor substrate, wherein the lower impurity region has a different conductivity type from a conductivity type of the well impurity region, the upper impurity region has a different conductivity type than the conductivity type of the lower impurity region, and the upper impurity region has a same conductivity type as the conductivity type of the well impurity region and has a higher impurity concentration than an impurity concentration of the well impurity region;

etching the semiconductor substrate to form lower semiconductor patterns, upper semiconductor patterns upwardly projecting from predetermined regions of the lower semiconductor patterns, wherein the upper semiconductor patterns have sidewalls vertically arranged with facing sidewalls of the lower semiconductor patterns and facing each other, a first space between the upper semiconductor patterns projecting from the lower semiconductor patterns, and a second space between the lower semiconductor patterns having a bottom surface disposed at a lower level than the lower impurity region, and wherein top surfaces of the lower semiconductor patterns disposed between the upper semiconductor patterns are disposed at a lower level than the upper impurity region and disposed at a higher level than a bottom surface of the lower impurity region; and forming an isolation layer filling the first and the second spaces between the lower semiconductor patterns and between the upper semiconductor patterns, respectively.

2. The method of claim 1, wherein the lower impurity region includes a first impurity region and a second impurity region disposed on the first impurity region, the first impurity region and the second impurity region having the same conductivity type as one another and the first impurity region having a higher impurity concentration than an impurity concentration of the second impurity region, and the lower impurity region and the upper impurity region constitute a diode.

3. The method of claim 1, wherein the forming of the lower and upper semiconductor patterns comprises:
  forming hard masks on the semiconductor substrate having the impurity regions, the hard masks being formed in the shape of lines of a first orientation;
  etching the semiconductor substrate using the hard masks as etch masks to form preliminary trenches;
  forming a sacrificial layer filling the preliminary trenches;
  forming sacrificial masks on the substrate having the sacrificial layer, the sacrificial masks being formed in the shape of lines of a second orientation crossing the first orientation;
  etching the hard masks using the sacrificial masks as etch masks to form hard mask patterns;
  removing the sacrificial masks and the sacrificial layer; and
  etching bottom regions of the preliminary trenches formed in the semiconductor substrate and the semiconductor substrate between the preliminary trenches using the hard mask patterns as etch masks to form the lower semiconductor patterns spaced apart from each other and the upper semiconductor patterns upwardly projecting from predetermined regions of the lower semiconductor patterns.

4. The method of claim 1, wherein the forming of the lower semiconductor patterns and the upper semiconductor patterns comprise:
  forming hard masks on the semiconductor substrate having the impurity regions, the hard masks being formed in the shape of lines of a first orientation;
  etching the semiconductor substrate using the hard masks as etch masks to form trenches, the trenches having bottom regions disposed at a lower level than the lower impurity region;
  forming a sacrificial layer filling the trenches;
  forming sacrificial masks on the semiconductor substrate having the sacrificial layer, the sacrificial masks being formed in the shape of lines of a second orientation crossing the first orientation;
  etching the hard masks using the sacrificial masks as etch masks to form a plurality of hard mask patterns spaced apart from each other;
  etching the semiconductor substrate between the trenches to a depth at a level lower than the upper impurity region and at a level higher than a bottom surface of the lower impurity region using the hard mask patterns and the sacrificial layer as etch masks to form the lower semiconductor patterns and the upper semiconductor patterns that are defined between the trenches; and
  removing the sacrificial masks and the sacrificial layer.

5. The method of claim 1, further comprising:
  partially etching the isolation layer to form a preliminary lower isolation pattern filling a space between the lower semiconductor patterns and exposing sidewalls of the upper semiconductor patterns where the upper impurity region is disposed;
  forming sidewall spacers surrounding the exposed sidewalls of the upper semiconductor patterns, the sidewall spacers being spaced apart from each other;
  partially etching the preliminary lower isolation pattern to form the lower isolation pattern, a top surface of the lower isolation pattern being disposed at a higher level than a bottom surface of the lower impurity region;
  forming a metal-semiconductor compound layer on sidewalls of the lower semiconductor patterns, which are not covered with the lower isolation pattern, and on top surfaces of the lower semiconductor patterns between the upper semiconductor patterns;
  forming an insulating material layer on the semiconductor substrate having the metal-semiconductor compound layer; and
  planarizing the insulating material layer until the hard mask patterns are exposed to form an upper isolation layer.

6. The method of claim 5, wherein the metal-semiconductor compound layer extends to partially cover sidewalls of the upper semiconductor patterns, is disposed at a lower level than the upper impurity region, and is spaced apart from the upper impurity region.

7. A method of fabricating a semiconductor device, comprising:
  forming a lower impurity region and an upper impurity region having different conductivity types than one another in a semiconductor substrate, the upper impurity region being disposed over the lower impurity region;
  etching the semiconductor substrate to form lower semiconductor patterns, upper semiconductor patterns upwardly projecting from predetermined regions of the lower semiconductor patterns, and a space between the lower semiconductor patterns having a bottom surface disposed at a lower level than the lower impurity region, and wherein top surfaces of the lower semiconductor patterns disposed between the upper semiconductor patterns are disposed at a lower level than the upper impurity region and disposed at a higher level than the bottom surface of the lower impurity region;
  forming spacers covering sidewalls of the upper semiconductor patterns to surround a boundary region between the lower impurity region and the upper impurity region;
  forming a lower isolation pattern partially filling the space between the lower semiconductor patterns, wherein a top surface of the lower isolation pattern being disposed at a higher level than the bottom surface of the lower impurity region; and
  forming a metal-semiconductor compound layer on sidewalls of the lower semiconductor patterns, which are not covered with the lower isolation pattern, and on top surfaces of the lower semiconductor patterns between the upper semiconductor patterns.

8. The method of claim 7, wherein the metal-semiconductor compound layer extends to partially cover sidewalls of the upper semiconductor patterns, is disposed at a lower level than the upper impurity region, and is spaced apart from the upper impurity region.

9. The method of claim 7, wherein the lower impurity region includes a first impurity region and a second impurity region disposed on the first impurity region, the first impurity region and the second impurity region having the same conductivity type as one another, and the first impurity region having a higher impurity concentration than an impurity concentration of the second impurity region.

10. The method of claim 7, further comprising forming a well impurity region having a same conductivity type as the upper impurity region and having a lower impurity concentration than the upper impurity region in the semiconductor substrate below the lower impurity region,
  wherein the well impurity region is formed in the semiconductor substrate between the lower semiconductor patterns, extends into the lower semiconductor patterns and is disposed at a lower level than the lower impurity region.

11. The method of claim 7, wherein the spacers surround sidewalls of the upper semiconductor patterns where the upper impurity region is disposed, and extend towards sidewalls of the upper semiconductor patterns where the lower impurity region is disposed.

12. The method of claim 7, wherein the forming of the spacers comprises:
   forming a preliminary isolation layer on the semiconductor substrate having the lower and upper semiconductor patterns;
   partially etching the preliminary isolation layer to form a preliminary isolation pattern, the preliminary isolation pattern filling the spaces between the lower semiconductor patterns, covering top surfaces of the lower semiconductor patterns disposed between the upper semiconductor patterns, and a top surface of the preliminary isolation pattern being disposed at a lower level than the upper impurity region; and
   forming the spacers covering sidewalls of the upper semiconductor patterns, which are not covered with the preliminary isolation pattern.

13. The method of claim 12, wherein the forming of the lower isolation pattern comprises:
   partially etching the preliminary isolation pattern, exposing top surfaces of the lower semiconductor patterns disposed between the upper semiconductor patterns, and exposing sidewalls of the lower semiconductor patterns where the lower impurity region remains.

14. The method of claim 7, wherein the forming of the lower semiconductor patterns and the upper semiconductor patterns comprises:
   forming hard masks on the semiconductor substrate, the hard masks being formed in the shape of lines parallel to each other and having a first orientation;
   etching the semiconductor substrate using the hard masks as etch masks to form preliminary trenches;
   forming a sacrificial layer filling the preliminary trenches;
   forming sacrificial masks on the substrate having the sacrificial layer, the sacrificial masks being formed in the shape of lines of a second orientation crossing the first orientation;
   etching the hard masks using the sacrificial masks as etch masks to form a plurality of hard mask patterns spaced apart from each other;
   removing the sacrificial masks and the sacrificial layer; and
   etching bottom regions of the preliminary trenches formed in the semiconductor substrate and the semiconductor substrate between the preliminary trenches using the hard mask patterns as etch masks.

15. The method of claim 7, wherein the forming of the lower semiconductor patterns and the upper semiconductor patterns comprises:
   forming hard masks on the semiconductor substrate, the hard masks being formed in the shape of lines parallel to each other and having a first orientation;
   etching the semiconductor substrate using the hard masks as etch masks and forming trenches, the trenches having bottom regions disposed at a lower level than the lower impurity region;
   forming a sacrificial layer filling the trenches;
   forming sacrificial masks on the semiconductor substrate having the sacrificial layer, the sacrificial masks being formed in the shape of lines of a second orientation crossing the first orientation;
   etching the hard masks using the sacrificial masks as etch masks to form a plurality of hard mask patterns spaced apart from each other;
   etching the semiconductor substrate between the trenches to a depth at a level lower than the upper impurity region and at a level higher than a bottom surface of the lower impurity region using the hard mask patterns and the sacrificial layer as etch masks to form the lower semiconductor patterns and the upper semiconductor patterns that are defined between the trenches; and
   removing the sacrificial masks and the sacrificial layer.

16. The method of claim 7, further comprising:
   forming an insulating material layer on the semiconductor substrate having the metal-semiconductor compound layer;
   planarizing the insulating material layer; and
   forming an upper isolation layer,
   wherein the upper isolation layer is formed on the lower isolation pattern, and fills between the lower semiconductor patterns that are not filled with the lower isolation pattern and between the upper semiconductor patterns.

17. The method of claim 7, further comprising:
   forming conductive patterns electrically connected to the upper impurity regions;
   forming information storage elements on the conductive patterns; and
   forming conductive lines in the shape of lines having an orientation crossing the lower semiconductor patterns on the information storage elements.

18. The method of claim 7, wherein the spacers are formed of a different material from the lower isolation pattern.

19. The method of claim 7, further comprising removing the spacers after forming the metal-semiconductor compound layer.

20. A method of fabricating a semiconductor device, comprising:
   performing an ion-implantation process to form a well impurity region, a lower impurity region and an upper impurity region in a semiconductor substrate, wherein the lower impurity region has a different conductivity type from a conductivity type of the well impurity region, the upper impurity region has a different conductivity type from than the conductivity type of the lower impurity region, and the upper impurity region has a same conductivity type as the conductivity type of the well impurity region and has a higher impurity concentration than an impurity concentration of the well impurity region, wherein the upper impurity region and the lower impurity region constitute a diode and wherein a lower part of the lower impurity region constitutes word lines;
   etching the semiconductor substrate to form lower semiconductor patterns, upper semiconductor patterns upwardly projecting from predetermined regions of the lower semiconductor patterns, a first space between the upper semiconductor patterns projecting from the lower semiconductor patterns, and a second space between the lower semiconductor patterns having a bottom surface disposed at a lower level than the lower impurity region, and wherein top surfaces of the lower semiconductor patterns disposed between the upper semiconductor patterns are disposed at a lower level than the upper impurity region and disposed at a higher level than a bottom surface of the lower impurity region;
   forming an isolation layer filling the first and the second spaces between the lower semiconductor patterns and between the upper semiconductor patterns, respectively;

forming a first interlayer insulating layer on the semiconductor substrate having the isolation layer;

forming holes penetrating the first interlayer insulating layer exposing the upper impurity regions;

performing a silicide process to form a metal-semiconductor compound layer on the upper impurity regions;

forming metal plugs on the metal-semiconductor compound layer by filling the holes in the first interlayer insulating layer;

foaming a second interlayer insulating layer on the semiconductor substrate having the metal plugs;

forming first conductive patterns penetrating the second interlayer insulating layer and electrically connected to the metal plugs;

sequentially forming information storage patterns and second conductive patterns on the semiconductor substrate having the first conductive patterns, wherein the information storage elements include a phase-change material layer whose resistance to a flowing current varies depending on a phase, wherein the information storage patterns are electrically connected to the diode formed of the upper impurity region and the lower impurity region through the first conductive patterns, the metal plugs and the metal semiconductor compound layer; and forming conductive lines on the second conductive patterns in the shape of lines crossing the lower semiconductor patterns and wherein the conductive lines constitute bit lines.

* * * * *